(12) United States Patent  (10) Patent No.: US 9,086,213 B2
Harbers et al.  (45) Date of Patent: Jul. 21, 2015

(54) ILLUMINATION DEVICE WITH LIGHT EMITTING DIODES

(75) Inventors: Gerard Harbers, Sunnyvale, CA (US); Mark A. Pugh, Los Gatos, CA (US); Menne T. de Roos, Saratoga, CA (US); John S. Yriberri, San Jose, CA (US); Peter K. Tseng, San Jose, CA (US)

(73) Assignee: Xicato, Inc., San Jose, CA (US)

( * ) Notice: Subject to any disclaimer, the term of this patent is extended or adjusted under 35 U.S.C. 154(b) by 1175 days.

(21) Appl. No.: 12/249,874

(22) Filed: Oct. 10, 2008

(65) Prior Publication Data

US 2009/0103296 A1   Apr. 23, 2009

Related U.S. Application Data

(63) Continuation-in-part of application No. 12/137,494, filed on Jun. 11, 2008, now abandoned.

(60) Provisional application No. 61/042,680, filed on Apr. 4, 2008, provisional application No. 61/062,223, filed on Jan. 23, 2008, provisional application No. 60/999,496, filed on Oct. 17, 2007.

(51) Int. Cl.
*F21V 29/00* (2006.01)
*F21K 99/00* (2010.01)
(Continued)

(52) U.S. Cl.
CPC ............... *F21V 29/004* (2013.01); *F21K 9/137* (2013.01); *F21K 9/54* (2013.01); *F21K 9/56* (2013.01);
(Continued)

(58) Field of Classification Search
CPC ......... F21Y 2101/02; F21K 9/56; F21K 9/54; H01L 2924/00
USPC ........... 362/234, 253, 296.01, 296.1, 296.04, 362/294, 231, 373, 800, 84; 313/498
See application file for complete search history.

(56) References Cited

U.S. PATENT DOCUMENTS 3,351,753 A   11/1967 Berger
3,593,055 A   7/1971 Geusic et al.
(Continued)

FOREIGN PATENT DOCUMENTS

AU   2007/100193 A4   4/2007
CN   1402884 A   3/2003
(Continued)

OTHER PUBLICATIONS

Invitation to Pay Additional Fees and Partial Search Report mailed on Jan. 23, 2009, for International Application No. PCT/US2008/079806 filed on Oct. 14, 2008, by Xicato, Inc., 12 pages.
(Continued)

*Primary Examiner* — Britt D Hanley
*Assistant Examiner* — Jessica M Apenteng
(74) *Attorney, Agent, or Firm* — Silicon Valley Patent Group LLP

(57) ABSTRACT

A light emitting device is produced using a plurality of light emitting diodes within a light mixing cavity formed by surrounding sidewalls. The sidewalls may be integrally formed as part of a surrounding heat sink or alternatively may be an insert into a cavity within a heat sink. The reflective sidewalls may be coated with a diffusing material and/or covered with one or more phosphors. Multiple phosphors are located at different locations of the cavity, e.g., on the sidewalls, a window covering the output port, or on a reflector attached to the bottom of the cavity. The light emitting diodes may be positioned rotationally symmetrically around the optical axis on a board.

16 Claims, 18 Drawing Sheets

(51) Int. Cl.
*F21V 7/22* (2006.01)
*F21V 23/04* (2006.01)
*F21V 29/71* (2015.01)
*F21V 29/77* (2015.01)
*F21V 29/80* (2015.01)
*F21V 29/83* (2015.01)
*F21V 29/02* (2006.01)
*F21Y 101/02* (2006.01)
*F21Y 103/02* (2006.01)
*H05K 1/02* (2006.01)

(52) U.S. Cl.
CPC .............. *F21V 7/22* (2013.01); *F21V 23/0457* (2013.01); *F21V 29/713* (2015.01); *F21V 29/773* (2015.01); *F21V 29/80* (2015.01); *F21V 29/83* (2015.01); *F21V 29/02* (2013.01); *F21Y 2101/02* (2013.01); *F21Y 2103/022* (2013.01); *H05K 1/0206* (2013.01)

(56) References Cited

U.S. PATENT DOCUMENTS

| | | |
|---|---|---|
| 4,766,526 A | 8/1988 | Morimoto et al. |
| 5,757,111 A | 5/1998 | Sato |
| 5,959,316 A | 9/1999 | Lowery |
| 5,962,971 A | 10/1999 | Chen |
| 5,966,393 A | 10/1999 | Hide et al. |
| 5,982,092 A | 11/1999 | Chen |
| 5,998,925 A | 12/1999 | Shimizu et al. |
| 6,066,861 A | 5/2000 | Hohn et al. |
| 6,068,383 A | 5/2000 | Robertson et al. |
| 6,132,072 A | 10/2000 | Turnbull et al. |
| 6,220,725 B1 | 4/2001 | Arnold |
| 6,234,648 B1 | 5/2001 | Borner et al. |
| 6,340,824 B1 | 1/2002 | Komoto et al. |
| 6,351,069 B1 | 2/2002 | Lowery et al. |
| 6,357,889 B1 | 3/2002 | Duggal et al. |
| 6,392,888 B1 | 5/2002 | Chen et al. |
| 6,469,322 B1 | 10/2002 | Srivastava et al. |
| 6,504,301 B1 | 1/2003 | Lowery |
| 6,576,930 B2 | 6/2003 | Reeh et al. |
| 6,586,882 B1 | 7/2003 | Harbers |
| 6,600,175 B1 | 7/2003 | Baretz et al. |
| 6,607,794 B1 | 8/2003 | Wilson et al. |
| 6,610,563 B1 | 8/2003 | Waitl et al. |
| 6,621,211 B1 | 9/2003 | Srivastava et al. |
| 6,649,946 B2 | 11/2003 | Bogner et al. |
| 6,653,661 B2 | 11/2003 | Okazaki |
| 6,680,569 B2 | 1/2004 | Mueller-Mach et al. |
| 6,705,748 B2 | 3/2004 | Morris |
| 6,724,142 B2 | 4/2004 | Ellens et al. |
| 6,734,465 B1 | 5/2004 | Taskar et al. |
| 6,765,237 B1 | 7/2004 | Doxsee et al. |
| 6,791,259 B1 | 9/2004 | Stokes et al. |
| 6,812,500 B2 | 11/2004 | Reeh et al. |
| 6,850,002 B2 | 2/2005 | Danielson et al. |
| 6,874,914 B2 * | 4/2005 | Desanto et al. ............... 362/372 |
| 6,942,360 B2 | 9/2005 | Chou et al. |
| 6,969,180 B2 | 11/2005 | Waters |
| 7,126,162 B2 | 10/2006 | Reeh et al. |
| 7,250,715 B2 | 7/2007 | Mueller et al. |
| 7,300,183 B2 | 11/2007 | Kiyomoto et al. |
| 7,325,949 B1 * | 2/2008 | Wang et al. ................... 362/373 |
| 7,479,662 B2 | 1/2009 | Soules et al. |
| 7,494,246 B2 | 2/2009 | Harbers |
| 7,527,393 B2 * | 5/2009 | Gordin et al. ................. 362/267 |
| 7,534,002 B2 | 5/2009 | Yamaguchi et al. |
| 7,564,180 B2 | 7/2009 | Brandes |
| 7,614,759 B2 | 11/2009 | Negley |
| 7,629,621 B2 | 12/2009 | Reeh et al. |
| 7,637,628 B2 * | 12/2009 | Budike ........................... 362/247 |
| 7,663,152 B2 * | 2/2010 | Bierhuizen et al. .............. 257/98 |
| 7,740,381 B2 * | 6/2010 | Gordin et al. ................. 362/297 |
| 7,810,956 B2 * | 10/2010 | Bierhuizen et al. ........... 362/294 |
| 2002/0043926 A1 | 4/2002 | Takahashi et al. |
| 2002/0085390 A1 | 7/2002 | Kiyomoto et al. |
| 2003/0076034 A1 | 4/2003 | Marshall et al. |
| 2003/0156416 A1 | 8/2003 | Stopa et al. |
| 2003/0230751 A1 | 12/2003 | Harada |
| 2004/0184272 A1 | 9/2004 | Wright et al. |
| 2005/0057145 A1 | 3/2005 | Shieh et al. |
| 2005/0073840 A1 | 4/2005 | Chou et al. |
| 2005/0111236 A1 | 5/2005 | Hulse |
| 2006/0013002 A1 | 1/2006 | Coushaine et al. |
| 2006/0087487 A1 | 4/2006 | Ota |
| 2006/0124953 A1 | 6/2006 | Negley et al. |
| 2006/0187653 A1 | 8/2006 | Olsson |
| 2006/0268544 A1 | 11/2006 | Rains, Jr. et al. |
| 2006/0291204 A1 | 12/2006 | Marka et al. |
| 2007/0081336 A1 | 4/2007 | Bierhuizen et al. |
| 2007/0133221 A1 | 6/2007 | Liu |
| 2007/0139923 A1 | 6/2007 | Negley et al. |
| 2007/0211463 A1 | 9/2007 | Chevalier et al. |
| 2007/0235639 A1 | 10/2007 | Rains, Jr. |
| 2007/0236935 A1 | 10/2007 | Wang |
| 2007/0242461 A1 | 10/2007 | Reisenauer et al. |
| 2007/0263393 A1 | 11/2007 | Van De Ven |
| 2008/0074880 A1 * | 3/2008 | Keen et al. ..................... 362/294 |
| 2008/0142816 A1 | 6/2008 | Bierhuizen et al. |
| 2010/0295067 A1 | 11/2010 | Vissenberg et al. |
| 2013/0200784 A1 | 8/2013 | Matsuura et al. |

FOREIGN PATENT DOCUMENTS

| | | |
|---|---|---|
| CN | 2685703 Y | 3/2005 |
| CN | 1784786 A | 6/2006 |
| CN | 2791469 Y | 6/2006 |
| DE | 10 2006 004 996 A1 | 8/2006 |
| DE | 2006 015 881 U1 | 12/2006 |
| EP | 0 890 996 | 1/1999 |
| EP | 1548851 A2 | 6/2005 |
| EP | 1857729 B1 | 11/2007 |
| JP | S62-17904 A | 1/1987 |
| JP | 2001-243821 A | 9/2001 |
| JP | 2001-272725 A | 10/2001 |
| JP | 2004-193031 A | 7/2004 |
| JP | 2005-311136 A | 11/2005 |
| JP | 3126627 U | 11/2006 |
| JP | 2007-026749 A | 2/2007 |
| JP | 2007-052994 A | 3/2007 |
| JP | 2007-156490 A | 6/2007 |
| JP | 2007-157943 A | 6/2007 |
| JP | 2007-173397 A | 7/2007 |
| JP | 2009-076494 A | 4/2009 |
| JP | 2010-507245 A | 3/2010 |
| TW | 200704148 A | 1/2007 |
| TW | 200719497 A | 5/2007 |
| TW | 200729566 A | 8/2007 |
| TW | M316976 U | 8/2007 |
| TW | 200732693 A | 9/2007 |
| TW | 200737555 A | 10/2007 |
| WO | WO 00/19546 | 4/2000 |
| WO | WO 2004/100265 | 11/2004 |
| WO | WO 2005/055328 A1 | 6/2005 |
| WO | WO 2005/078338 A1 | 8/2005 |
| WO | WO 2007/037605 | 4/2007 |
| WO | WO 2007/111355 A1 | 10/2007 |
| WO | WO 2007/130536 A2 | 11/2007 |
| WO | WO 2007/130536 A3 | 11/2007 |
| WO | WO 2008/142638 A1 | 11/2008 |
| WO | WO 2008/149250 | 12/2008 |
| WO | WO 2009/021859 | 2/2009 |

OTHER PUBLICATIONS

International Search Report and Written Opinion dated Apr. 6, 2009, for Int'l Application No. PCT/US2008/079806 filed on Oct. 14, 2008, by Xicato, Inc., 30 pages.

English Abstract of CN-2685703 filed on Mar. 16, 2005 at <http://worldwide.espacenet.com> Visited on Nov. 2, 2011, one page.

English Abstract of CN-2791469 filed on Jun. 28, 2006 at <http://worldwide.espacenet.com> Visited on Nov. 2011, one page.

(56) References Cited

OTHER PUBLICATIONS

International Search Report and Written Opinion mailed on Oct. 5, 2009 for International Application No. PCT/US2008/079806 filed on Oct. 14, 2008, thirty pages.
International Preliminary Report on Patentability mailed on Apr. 29, 2010 for International Application No. PCT/US2008/079806 filed on Oct. 14, 2008, fifteen pages.
Machine Translation in English of abstract for JP 2007-052994 A visited at www.espacenet.com on Mar. 7, 2014, 2 pages.
Machine Translation in English of abstract for JP 2004-193031 visited at www.espacenet.com on Jul. 24, 2013, 2 pages.
Machine Translation in English of abstract for JP 3126627, 2 pages.
Machine Translation in English of abstract for JP 2007-173397 visited at www.espacenet.com on Jul. 24, 201 , 2 pages.
Summary Translation in English for JP 2007-026749 published on Feb. 1, 2007 by Mitsubishi Electric Corp., 2 pages.
Summary Translation in English for JP 2009-076494 published on Apr. 9, 2009 by Panasonic Electric Works Co. Ltd., 2 pages.
Summary Translation in English for WO 2005/055328 published on Jun. 16, 2005 by Mitsubishi Electric Lighting Corp., 2 pages.
Machine Translation in English of abstract for JP 2001-243821 published on Sep. 7, 2001 by Mitsubishi Electric Lighting Corp., 2 pages.
Machine Translation in English of abstract for JP 2001-272725 published on Oct. 5, 2001 by NEC Viewtechnology Ltd., 2 pages.
Machine Translation in English of abstract for JP 2005-311136 published on Nov. 4, 2005 by Mitsubishi Electric Works Ltd., 2 pages.
Machine Translation in English of abstract for JP 2007-157943- published on Jun. 21, 2007 by Stanley Electric Ltd., 2 pages.

\* cited by examiner

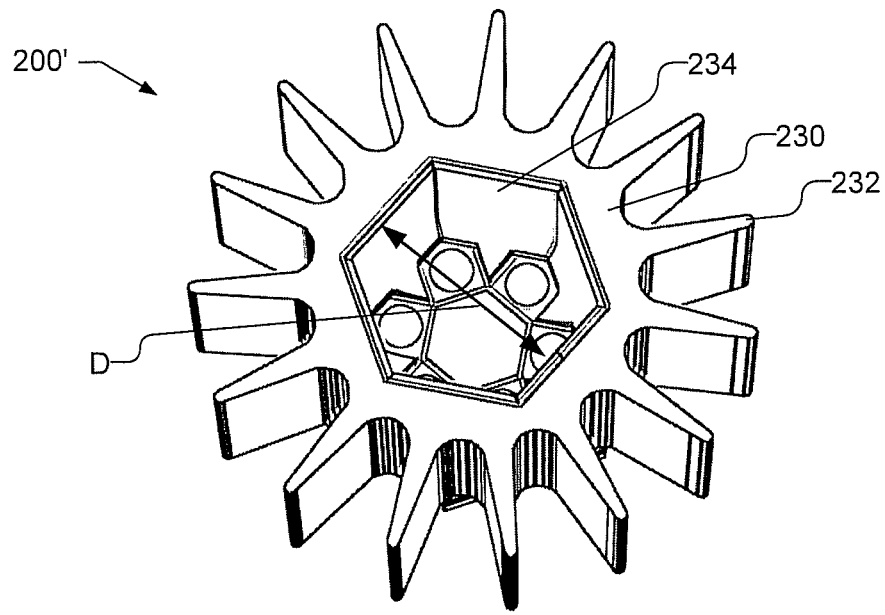
Fig. 10A
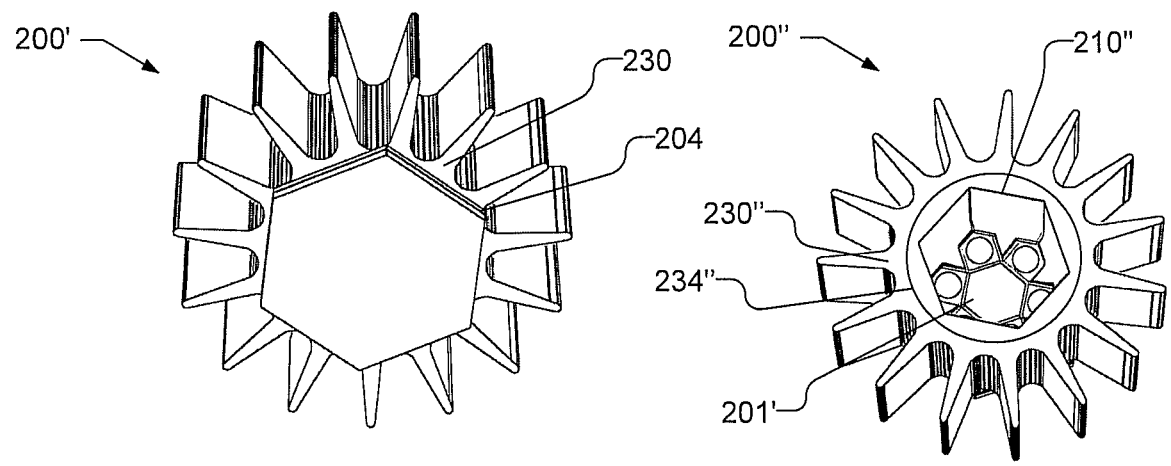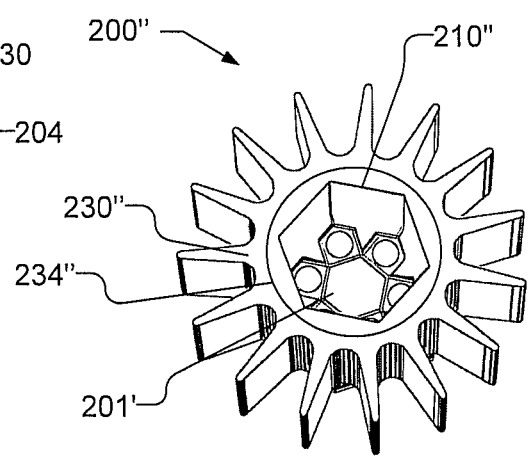
Fig. 10B
Fig. 10C

ILLUMINATION DEVICE WITH LIGHT EMITTING DIODES

CROSS REFERENCE TO RELATED APPLICATIONS

This application claims the benefit of Provisional Application No. 60/999,496, filed Oct. 17, 2007; Provisional Application No. 61/062,223, filed Jan. 23, 2008; and Provisional Application No. 61/042,680, filed Apr. 4, 2008, and is a continuation-in-part of U.S. application Ser. No. 12/137,494, filed Jun. 11, 20008, all of which are incorporated by reference herein in their entirety.

FIELD OF THE INVENTION

This invention relates generally to the field of general illumination, and more specifically, to illumination devices using light emitting diodes (LEDs).

BACKGROUND

The use of light emitting diodes in general lighting is still limited due to limitations in light output level or flux generated by the illumination devices due to the limited maximum temperature of the LED chip, and the life time requirements, which are strongly related to the temperature of the LED chip. The temperature of the LED chip is determined by the cooling capacity in the system, and the power efficiency of device (optical power produced by the LEDs and LED system, versus the electrical power going in). Illumination devices that use LEDs also typically suffer from poor color quality characterized by color point instability. The color point instability varies over time as well as from part to part. Poor color quality is also characterized by poor color rendering, which is due to the spectrum produced by the LED light sources having bands with no or little power. Further, illumination devices that use LEDs typically have spatial and/or angular variations in the color. Additionally, illumination devices that use LEDs are expensive due to, among other things, the necessity of required color control electronics and/or sensors to maintain the color point of the light source or using only a selection of LEDs produced, which meet the color and/or flux requirements for the application.

Consequently, improvements to illumination device that uses light emitting diodes as the light source are desired.

SUMMARY

A light emitting device is produced using a plurality of light emitting diodes within a light mixing cavity formed by surrounding sidewalls. In one embodiment, a continuous circular or elliptical sidewall is used, or alternatively multiple sidewalls may be used in a discontinuous polygonal configuration. The sidewalls may be beveled so that a cross-sectional area near the bottom of the sidewalls, i.e., near the LEDs, is greater or less than the cross-sectional area near the top of the sidewalls, i.e., near the output port. The sidewalls may be integrally formed as part of a surrounding heat sink or alternatively may be an insert into a cavity within a heat sink. The reflective sidewalls may be coated with a diffusing material and/or covered with one or more phosphors. In one embodiment, different types of wavelength converting materials, e.g., phosphors, are located at different locations of the cavity. For example, patterns maybe formed using multiple phosphors on the sidewalls or a central reflector. Additionally, one or more phosphors may be located on a window that covers the output port of the illumination device. Additionally, the areas in between the light emitting diodes may be partially or fully covered with at least one phosphor material or lenses on the LEDs may be coated with a thin layer of phosphor. Further, the light emitting diodes may be positioned rotationally symmetrically around the optical axis on a board.

BRIEF DESCRIPTION OF THE DRAWINGS

FIGS. 10A and 10B illustrate top and bottom perspective views, respectively, of another illumination device.

FIG. 10C illustrates another top perspective view of an illumination device similar to that shown in FIG. 10A.

DETAILED DESCRIPTION

Figure 1:
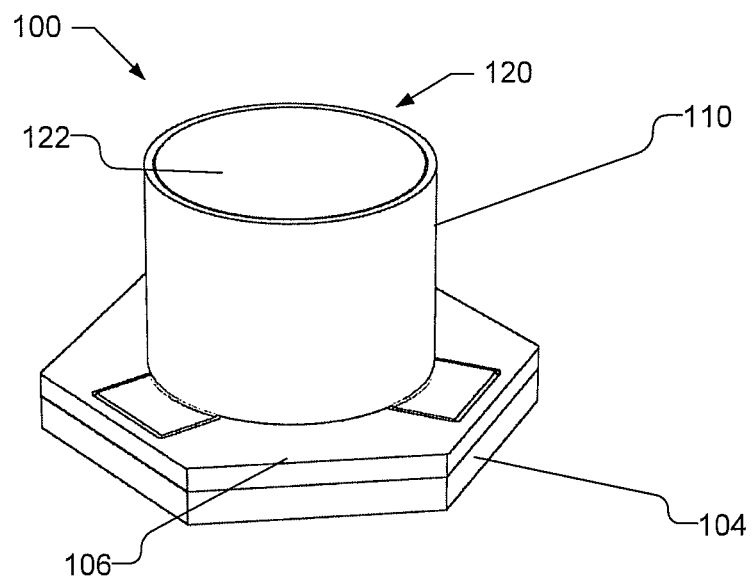
FIGS. 1 and 2 illustrate perspective views of an embodiment of an illumination device that uses light emitting diodes (LEDs) as a light source.
Figure 2:
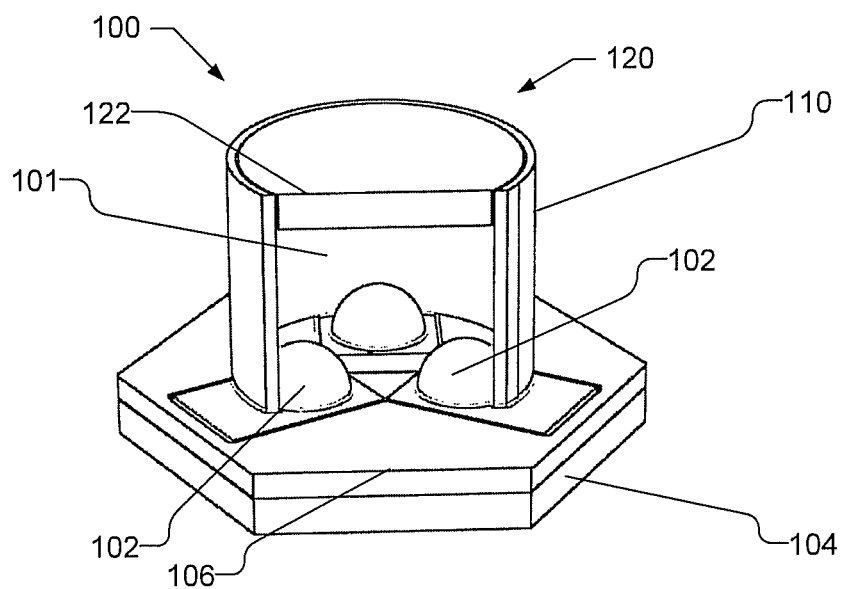
Figure 3:
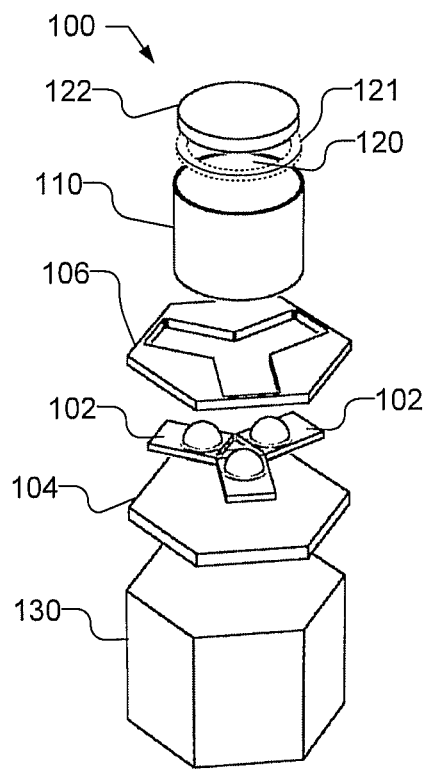
FIG. 3 illustrates a perspective exploded view of the illumination device.
Figure 4A:
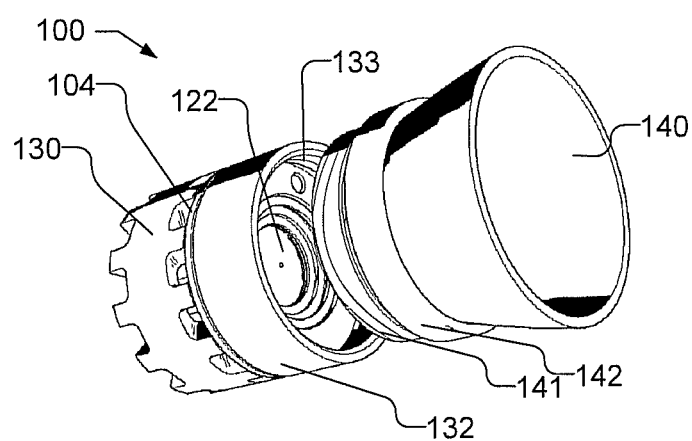
FIGS. 4A and 4B illustrate a perspective view and a cross-sectional view of an embodiment of the illumination device in which multiple heat sinks are used.
Figure 4B:
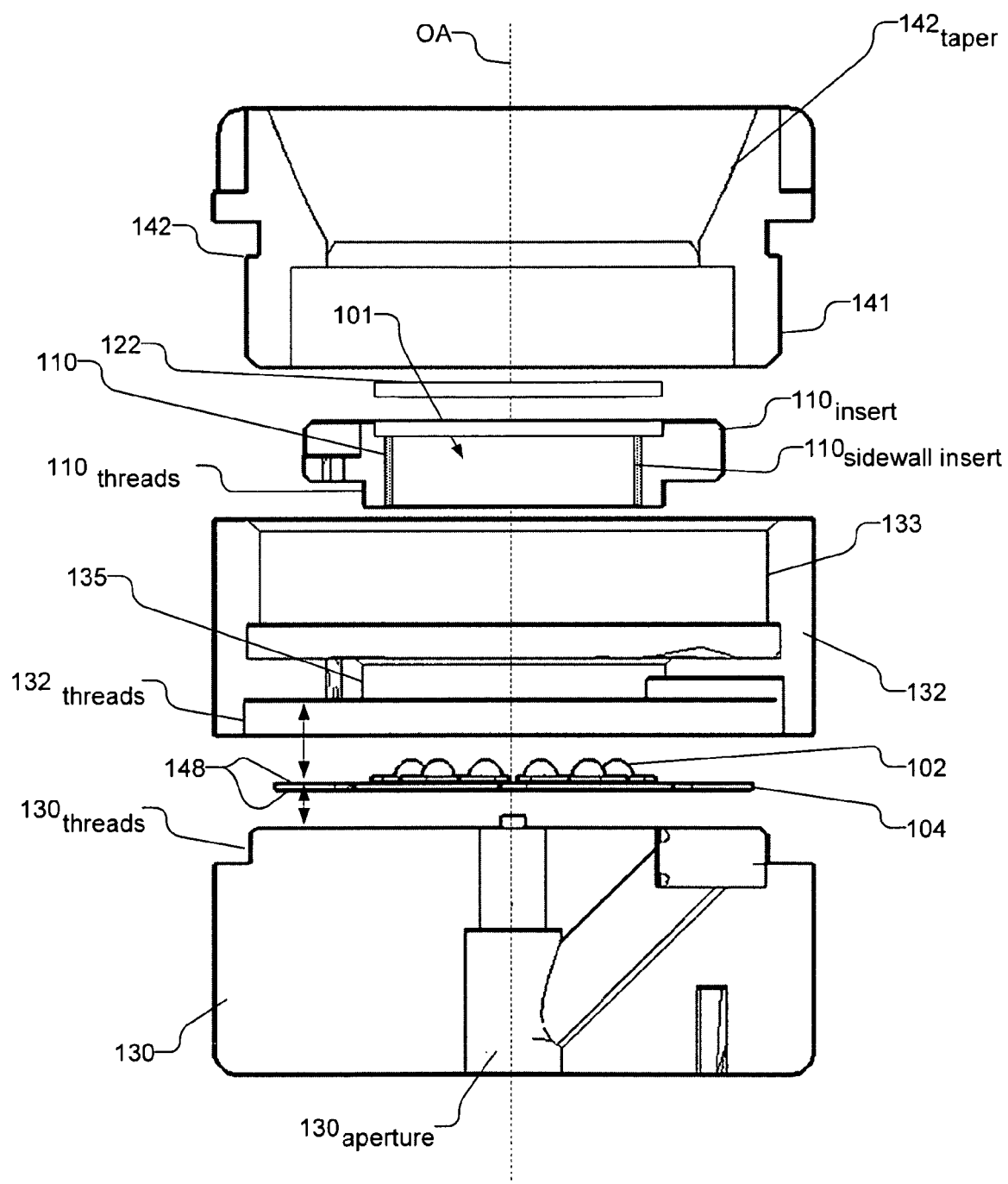

FIGS. 1 and 2 illustrate perspective views of an embodiment of a light emitting diode (LED) illumination device 100, where FIG. 2 shows a cut-away view illustrating inside of the LED illumination device 100. It should be understood that as defined herein an LED illumination device is not an LED, but is an LED light source or fixture or component part of an LED light source or fixture and that contains an LED board, which includes one or more LED die or packaged LEDs. FIG. 3 illustrates a perspective, exploded view of the LED illumination device 100. FIGS. 4A and 4B illustrate a perspective view and a cross-sectional view of an embodiment of the LED illumination device 100 in which multiple heat sinks are used. The LED illumination device 100 includes one or more solid state light emitting elements, such as a light emitting diodes (LEDs) 102 mounted on a LED board 104 that is attached to or combined with a heat spreader or heat sink 130 (shown in FIGS. 3, 4A and 4B). The board 104 may include a reflective top surface or a reflective plate 106 attached to the top surface of the board 104. The reflective plate 106 may be made from a material with high thermal conductivity and may be placed in thermal contact with the board 104. The LED illumination device 100 further includes reflective side walls 110 that are coupled to the board 104. The side walls 110 and board 104 with the reflective plate 106 define a cavity 101 in the LED illumination device 100 in which light from the LEDs 102 is reflected until it exits through an output port 120, although a portion of the light may be absorbed in the cavity. Reflecting the light within the cavity 101 prior to exiting the output port 120 has the effect of mixing the light and providing a more uniform distribution of the light that is emitted from the LED illumination device 100.

The reflective side walls 110 may be made with highly thermally conductive material, such as an aluminum based material that is processed to male the material highly reflective and durable. By way of example, a material referred to as Miro®, manufactured by Alanod, a German company, may be used as the side walls 110. The high reflectivity of the side walls 110 can either be achieved by polishing the aluminum, or by covering the inside surface of the side walls 110 with one or more reflective coatings. If desired, the reflective surface of the side walls 110 may be achieved using a separate insert that is placed inside a heat sink, as illustrated in FIG. 4A, where the insert is made of a highly reflective material. By way of example, the insert can be inserted into the heat sink from the top or the bottom (before mounting the side wall 110 to the board 106), depending on the side wall section having a larger opening at the top or bottom. The inside of the side wall 110 can either be specular reflective, or diffuse reflective. An example of a highly specular reflective coating is a silver mirror, with a transparent layer protecting the silver layer from oxidation. Examples of highly diffuse reflective coatings are coatings containing titanium dioxide (TiO2), zinc oxide (ZnO), and barium sulfate (BaSO4) particles, or a combination of these materials. In one embodiment, the side wall 110 of the cavity 101 may be coated with a base layer of white paint, which may contain TiO2, ZnO, or BaSO4 particles, or a combination of these materials. An overcoat layer that contains a wavelength converting material, such as phosphor or luminescent dyes may be used, which will be generally referred to herein as phosphor for the sake of simplicity. By way of example, phosphor that may be used include $Y_3Al_5O_{12}$:Ce, $(Y,Gd)_3Al_5O_{12}$:Ce, CaS:Eu, SrS:Eu, $SrGa_2S4$:Eu, $Ca_3(Sc,Mg)_2Si_3O_{12}$:Ce, $Ca_3Sc_2Si_3O_{12}$:Ce, $Ca_3Sc_2O_4$:Ce, $Ba_3Si_6O_{12}N_2$:Eu, $(Sr,Ca)AlSiN_3$:Eu, $CaAlSiN_3$:Eu. Alternatively, the phosphor material may be applied directly to the side walls, i.e., without a base coat.

The reflective side walls 110 may define the output port 120 through which light exits the illumination device 100. In another embodiment, a reflective top 121 that is mounted on top of the reflective side walls 110 may be used to define the output port 120, as illustrated with broken lines in FIG. 3. The output port 120 may include a window 122, which may be transparent or translucent to scatter the light as it exits. The window 122 may be manufactured from an acrylic material that includes scattering particles, e.g., made from TiO2, ZnO, or BaSO4, or other material that have low absorption over the full visible spectrum. In another embodiment, the window 122 may be a transparent or translucent plate with a microstructure on one or both sides. By way of example, the microstructure may be a lenslet array, or a holographic microstructure. Alternatively, the window 122 may be manufactured from $AlO_2$, either in crystalline form (Sapphire) or on ceramic form (Alumina), which is advantageous because of its hardness (scratch resistance), and high thermal conductivity. The thickness of the window may be between e.g., 0.5 and 1.5 mm. If desired, the window may have diffusing properties. Ground sapphire disks have good optical diffusing properties and do not require polishing. Alternatively, the diffuse window may be sand or bead blasted windows or plastic diffusers, which are made diffusing by dispersing scattering particles into the material during molding, or by surface texturing the molds.

The cavity 101 may be filled with a non-solid material, such as air or an inert gas, so that the LEDs 102 emit light into the non-solid material as opposed to into a solid encapsulent material. By way of example, the cavity may be hermetically sealed and Argon gas used to fill the cavity. Alternatively, Nitrogen may be used.

While the side walls 110 are illustrated in FIGS. 1 and 2 as having a continuous circular tubular configuration, other configurations may be used. For example, the side walls may be formed from a single continuous side wall in an elliptical configuration (which includes a circular configuration), or multiple side walls may be used to form a discontinuous configuration, e.g., triangle, square, or other polygonal shape (for the sake of simplicity, side walls will be generally referred to herein in the plural). Moreover, if desired, the side walls may include continuous and discontinuous portions. Further, the cavity 101 defined by the side walls 110 may be beveled so that there are differently sized cross-sectional areas at the bottom (i.e., near the LEDs 102) and at the top (near the output port 120).

The board 104 provides electrical connections to the attached LEDs 102 to a power supply (not shown). Additionally, the board 104 conducts heat generated by the LEDs 102 to the sides of the board and the bottom of the board 104, which may be thermally coupled to a heat sink 130 (shown in FIGS. 3, 4A and 4B), or a lighting fixture and/or other mechanisms to dissipate the heat, such as a fan. In some embodiments, the board 104 conducts heat to a heat sink thermally coupled to the top of the board 104, e.g., surrounding side walls 110.

By way of example, FIGS. 4A and 4B illustrate illumination device 100 with a bottom heat sink 130 and a top heat sink 132 and the board 104 disposed between bottom and top heat sinks 130, 132, along with the optical axis OA illustrated with a dotted line. In one embodiment, the board 104 may be bonded to the heat sinks 130 and 132 by way of thermal epoxy. Alternatively or additionally, the heat sinks 130, 132 may be screwed together, via threads $130_{thread}$ and $132_{threads}$, to clamp the board 104 between the heat sinks 130 and 132, as illustrated in FIG. 4B. As can be seen in FIG. 4B, the board 104 may include thermal contact areas 148, sometimes referred to as heat spreaders on both the top and bottom surfaces that are thermally coupled to the top and bottom heat sinks 130 and 132, as indicated by the arrows, e.g., using thermal grease, thermal tape or thermal epoxy. As illustrated in FIG. 4B, the sidewalls 110 are formed using a separate insert $110_{insert}$ piece that is inserted into and held in heat sink 132, e.g., by thermal epoxy or by threads $110_{threads}$ and 135, or by bolts. A removable sidewall insert $110_{sidewall\ insert}$ may be positioned within insert $110_{insert}$ and used to define the sidewalls. The sidewall insert $110_{sidewall\ insert}$ may be e.g., manufactured from a material referred to as Miro®, type Miro 27 Silver, manufactured by Alanod, a German company. Additionally, if desired, the sidewall insert $110_{sidewall\ insert}$ may be coated or impregnated (if sidewall insert $110_{sidewall\ insert}$ is manufactured from plastic, ceramic, glass or other appropriate material) with one or more wavelength converting materials and/or highly diffuse reflective coatings, such as is described in reference to FIG. 4A as well as e.g., FIGS. 15A and 15B. The adjustment of color point of the illumination device may be accomplished by replacing the sidewall insert $110_{sidewall\ insert}$, and/or the window 122, which similarly may be coated or impregnated with one or more wavelength converting materials. FIG. 4B illustrates the side walls as having a linear configuration, but it should understood that side walls 110 may have any desired configuration, e.g., curved, non-vertical, beveled etc. In one embodiment, when the insert $110_{insert}$ is inserted into heat sink 132 from the top, an additional heat sink 142 may be coupled to top heat sink 132 and used to clamp the insert $110_{insert}$ in position in the heat sink 132. It should be understood that the additional heat sink 142 is optional. When the insert $110_{insert}$ is inserted into heat sink 132 from the bottom, the bottom heat sink 130 may clamp the insert $110_{insert}$ in position. Alternatively, the sidewalls 110 may be integrally formed from heat sink 132. The window 122 may be mounted in the insert $110_{insert}$, e.g., using glue or clamps, such as clamping it between the insert $110_{insert}$ and a heat sink 142 or 132. The bottom heat sink may include an aperture $130_{aperture}$ so that electrical connections can be made to the board 104. An optical element, such as a diffuser or reflector 140 may be removably coupled to the top heat sink 132, e.g., by means of threads 133 and 141 or a clamp or other appropriate mechanism. In one embodiment, the reflector 140 (FIG. 4A) may be integrally formed from the additional heat sink 142 or may be mounted to the heat sink 142, e.g., at the tapered walls $142_{taper}$ of the heat sink 142 (FIG. 4B).

The LED board 104 is a board upon which is mounted one or more LED die or packaged LEDs. The board may be an FR4 board, e.g., that is 0.5 mm thick, with relatively thick copper layers, e.g., 30 μm to 100 μm, on the top and bottom surfaces that serve as thermal contact areas. The board 104 may also include thermal vias. Alternatively, the board 104 may be a metal core printed circuit board (PCB) or a ceramic submount with appropriate electrical connections. Other types of boards may be used, such as those made of alumina (aluminum oxide in ceramic form), or aluminum nitride (also in ceramic form). The side walls 110 may be thermally coupled to the board 104 to provide additional heat sinking area.

For good cooling of the LEDs, a thermal contact area of at least 50 square millimeter, but preferably 100 square millimeter should be used per one watt going into the LEDs on the board. For example, in the case when 12 LEDs are used, a 600 to 1200 square millimeter heatsink contact area should be used. By using contact areas on both sides of the boards the diameter of the board can be reduced from 60 to 40 mm, which reduces the cost of the board, but also decreases the total size and volume of the illumination device, and makes it much easier to use it in existing lighting fixture designs.

Referring back to FIG. 3, the reflective plate 106 may be mounted on the top surface of the board 104, around the LEDs 102. The reflective plate 106 may be highly reflective so that light reflecting downward in the cavity 101 is reflected back generally towards the output port 120. Additionally, the reflective plate 106 may have a high thermal conductivity, such that it acts as an additional heat spreader. By way of example, the reflective plate 106 may be manufactured from a material including enhanced Aluminum. The reflective plate 106 may not include a center piece between the LEDs 102, but if desired, e.g., where a large number of LEDs 102 are used, the reflective plate 106 may include a portion between the LEDs 102 or alternatively a central diverter, such as that illustrated in FIGS. 14A, 14B and 19A. The thickness of the reflective plate 106 may be approximately the same thickness as the submounts of the LEDs 102 or slightly thicker. The reflective plate might alternatively be made from a highly reflective thin material, such as Vikuiti™ ESR, as sold by 3M (USA), which has a thickness of 65 μm, in which holes are punched at the light output areas of the LEDs, and which is mounted over the LEDs, and the rest of the board 104. The side walls 110 and the reflective plate 106 may be thermally coupled and may be produced as one piece if desired. The reflective plate 106 may be mounted to the board 104, e.g., using a thermal conductive paste or tape. In another embodiment, the top surface of the board 104 itself is configured to be highly reflective, so as to obviate the need for the reflective plate 106. Alternatively, a reflective coating might be applied to board 104, the coating composed of white particles e.g. made from TiO2, ZnO, or BaSO4 immersed in a transparent binder such as an epoxy, silicone, acrylic, or N-Methylpyrrolidone (NMP) materials. Alternatively, the coating might be made from a phosphor material such as YAG:Ce. The coating of phosphor material and/or the TiO2, ZnO or GaSO4 material may be applied directly to the board 104 or to, e.g., the reflective plate 106, for example, by screen printing. Typically in screen printing small dots are deposited. The dots might be varied in size and spatial distribution to achieve a more uniform or more peaked luminance distribution over the window 122, to facilitate either more uniform or more peaked illumination patterns in the beam produced by an embodiment such as that shown in FIG. 4A.

As illustrated in FIGS. 1 and 2, multiple LEDs 102 may be used in the illumination device 100. The LEDs 102 are positioned rotationally symmetrically around the optical axis of the illumination device 100, which extends from the center of the cavity 101 at the reflective plate 106 (or board 104) to the center of the output port 110, so that the light emitting surfaces or p-n junctions of the LEDs are equidistant from the optical axis. The illumination device 100 may have more or fewer LEDs, but six (6) to ten (10) LEDs has been found to be a useful quantity of LEDs 102. In one embodiment, twelve (12) or fourteen (14) LEDs are used. When a large number of LEDs is used, it may be desirable to combine the LEDs into multiple strings, e.g., two strings of six (6) or seven (7) LEDs, in order to maintain a relatively low forward voltage and current, e.g., no more than 24V and 700 mA. If desired, a larger number of the LEDs may be placed in series, but such a configuration may lead to electrical safety issues.

In one embodiment, the LEDs 102 are packaged LEDs, such as the Luxeon Rebel manufactured by Philips Lumileds Lighting. Other types of packaged LEDs may also be used, such as those manufactured by OSRAM (Ostar package), Luminus Devices (USA), or Tridonic (Austria). As defined herein, a packaged LED is an assembly of one or more LED die that contains electrical connections, such as wire bond connections or stud bumps, and possibly includes an optical element and thermal, mechanical, and electrical interfaces. The LEDs 102 may include a lens over the LED chips. Alternatively, LEDs without a lens may be used. LEDs without lenses may include protective layers, which may include phosphors. The phosphors can be applied as a dispersion in a binder, or applied as a separate plate. Each LED 102 includes at least one LED chip or die, which may be mounted on a submount. The LED chip typically has a size about 1 mm by 1 mm by 0.5 mm, but these dimensions may vary. In some embodiments, the LEDs 102 may include multiple chips. The multiple chips can emit light similar or different colors, e.g., red, green, and blue. In addition, different phosphor layers may be applied on different chips on the same submount. The submount may be ceramic or other appropriate material and typically includes electrical contact pads on a bottom surface, which is coupled to contacts on the board 104. Alternatively, electrical bond wires may be used to electrically connect the chips to a mounting board, which in turn is connected to a power supply. Along with electrical contact pads, the LEDs 102 may include thermal contact areas on the bottom surface of the submount through which heat generated by the LED chips can be extracted. The thermal contact areas are coupled to a heat spreading layer on the board 104.

The LEDs 102 can emit different or the same colors, either by direct emission or by phosphor conversion, e.g., where the different phosphor layers are applied to the LEDs. Thus, the illumination device 100 may use any combination of colored LEDs 102, such as red, green, blue, amber, or cyan, or the LEDs 102 may all produce the same color light or may all produce white light. For example, the LEDs 102 may all emit either blue or UV light when used in combination with phosphors (or other wavelength conversion means), which may be, e.g., in or on the window 122 of the output port 120, applied to the inside of the side walls 110, or applied to other components placed inside the cavity (not shown), such that the output light of the illumination device 100 has the color as desired. The phosphors may be chosen from the set denoted by the following chemical formulas: $Y_3Al_5O_{12}$:Ce, (also known as YAG:Ce, or simply YAG) $(Y,Gd)_3Al_5O_{12}$:Ce, CaS: Eu, SrS:Eu, $SrGa_2S4$:Eu, $Ca_3(Sc,Mg)_2Si_3O_{12}$:Ce, $Ca_3Sc_2Si_3O_{12}$:Ce, $Ca_3Sc_2O_4$:Ce, $Ba_3Si_6O_{12}N_2$:Eu, $(Sr,Ca)AlSiN_3$:Eu.

In one embodiment a YAG, phosphor is used on the side walls 110 and the reflective plate 106 at the bottom of the cavity 101, and a red emitting phosphor such as $CaAlSiN_3$:Eu, or $(Sr,Ca)AlSiN_3$:Eu is used on the window 122 of the output port 120. By choosing the shape and height of the side walls that define the cavity, and selecting which of the parts in the cavity will be covered with phosphor or not, and by optimization of the layer thickness of the phosphor layer on the window, the color point of the light emitted from the module can be tuned as desired.

Figure 5:
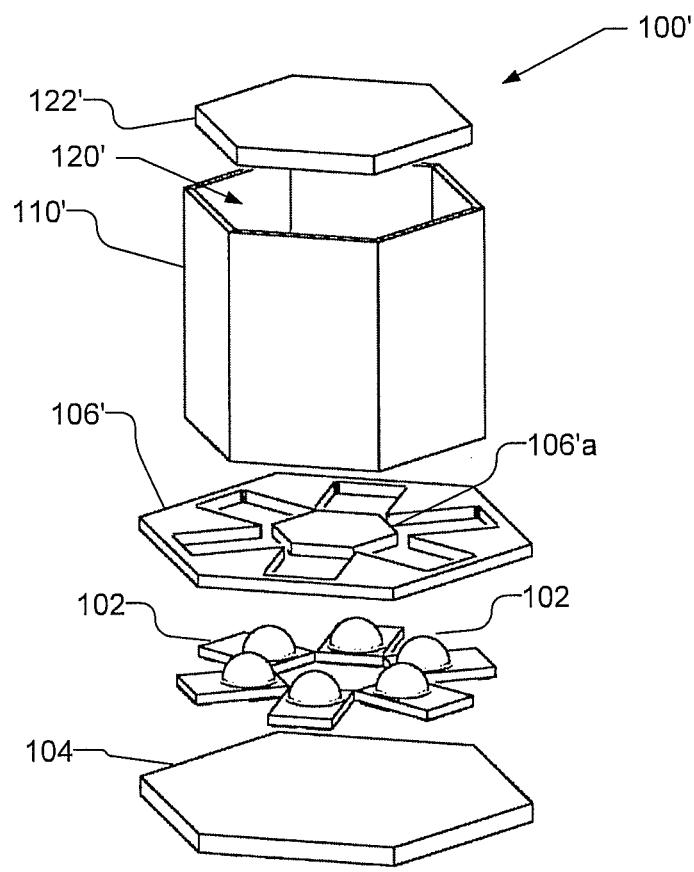
FIG. 5 illustrates an exploded perspective view of another embodiment of a solid state illumination device using a larger number of LEDs, and a polygon shaped sidewall.

FIG. 5 illustrates an exploded perspective view of another embodiment of a solid state illumination device 100', that is similar to the illumination device 100 shown in FIG. 3, except that the illumination device 100' includes additional LEDs 102 and differently shaped side walls 110', output port 120' and window 122'. As can be seen in FIG. 5, the illumination device 100' includes hexagonal tubular side walls 110', which define a hexagonal output port 120' and the window 122'. It should be understood that the side walls may have other configurations, including square, pentagonal, or other polygonal shapes. The use of square, pentagonal or hexagonal cross sectional tubes to from the side walls of the illumination device may provide superior light mixing relative to a circular cross sectional tube. With the use of a larger number of LEDs, it is desirable for the side walls to have a polygonal cross section with the number of sides equal to, or an integer multiple of, the number of LEDs. For example, with the use of twelve (12) LEDs, a twelve sided polygon, i.e., a dodecagon, or a polygon with 24 or 36 sides may be used. Moreover, it may be desirable to use an insert for the side walls, so that the number of sides may easily be changed, e.g., if the number of LEDs is altered, without requiring modification of other parts of the device.

As illustrated in FIG. 5, the illumination device 100' includes six (6) LEDs 102 with rotationally symmetric placement. The reflective plate 106' is configured to accommodate the six LEDs 102. As can be seen in FIG. 5, the reflective plate 106' includes a center portion 106'a that is configured to be placed between the center of the LEDs 102.

Figure 6:
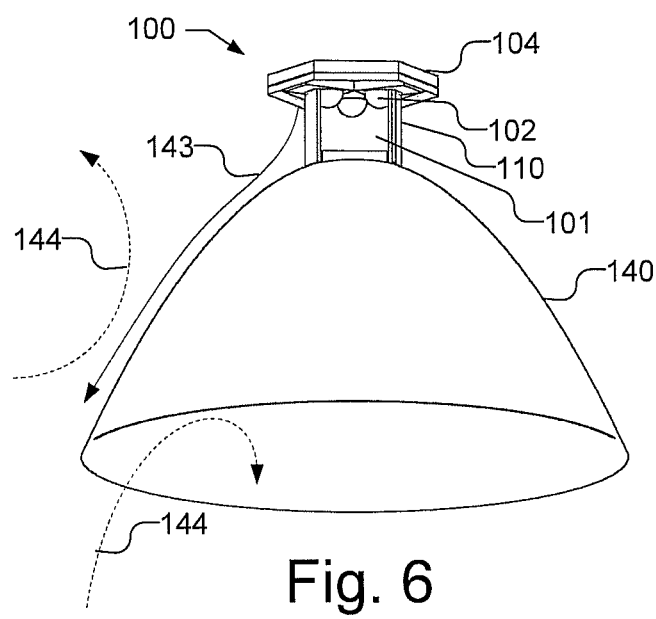
FIG. 6 illustrates a side view of an application of the illumination device in a down light configuration or other similar configuration, such as a spot lamp for task lighting.

FIG. 6 illustrates a side view of an application of the illumination device in a down light configuration or other similar configuration, such as a spot lamp for task lighting. A portion of the side walls 110 are shown cut out so that the LEDs 102 inside the light mixing cavity 101 are visible. As illustrated, the illumination device 100 further includes a reflector 140 for collimating the light that is emitted from the light mixing cavity 101. The reflector 140 may be made out of a thermal conductive material, such as a material that includes aluminum or copper and may be thermally coupled to a heat spreader on the board 104, as discussed in reference to FIG. 4A, along with or through the side walls 110. Heat flows through conduction through heat spreaders attached to the board, the thermally conductive side wall, and the thermal conductive reflector 140, as illustrated by arrow 143. Heat also flows via thermal convection over the reflector 140 as illustrated by arrows 144. The heat spreader on the board may be attached to either the light fixture, or to a heat sink, such as heat sink 130 and/or heat sink 132, shown in FIGS. 3 and 4A.

Figure 7A:
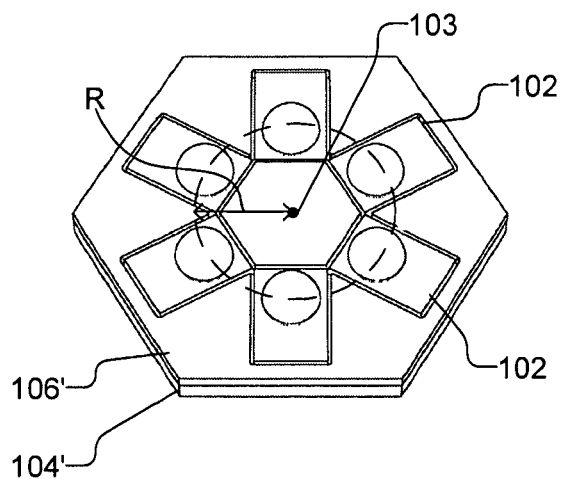
FIGS. 7A and 7B illustrate different placement patterns on the LEDs for the illumination device.
Figure 7B:
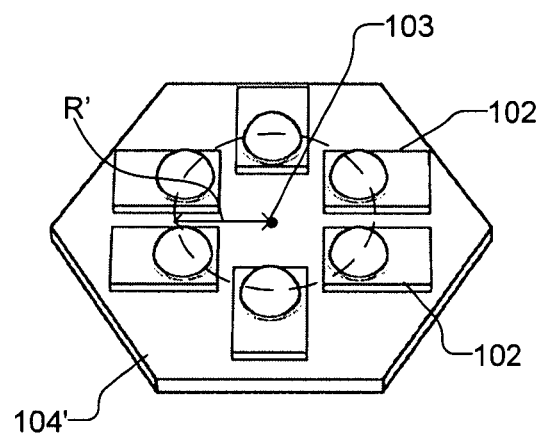

FIGS. 7A and 7B illustrate different placement patterns of the LEDs 102 on a board 104', both of which retain rotationally symmetry to the optical axis at the center. In FIG. 7A, the LEDs 102 are configured radially on the board 104, so that there is rotational symmetry around a central axis 103, i.e., all the LED chips, in particular the p-n junctions, are all approximately the same distance R from the central axis 103. FIG. 7B shows the LEDs 102 placed with orthogonal orientations on the board 104' (without the overlying reflective plate 106'). The use of orthogonal orientations of the LEDs is preferred by some component pick and place machines. As can be seen in FIG. 7B, however, the LED chips are all approximately the same distance R' from the central axis 103, and are therefore rotational symmetric around a central axis 103.

Figure 7C:
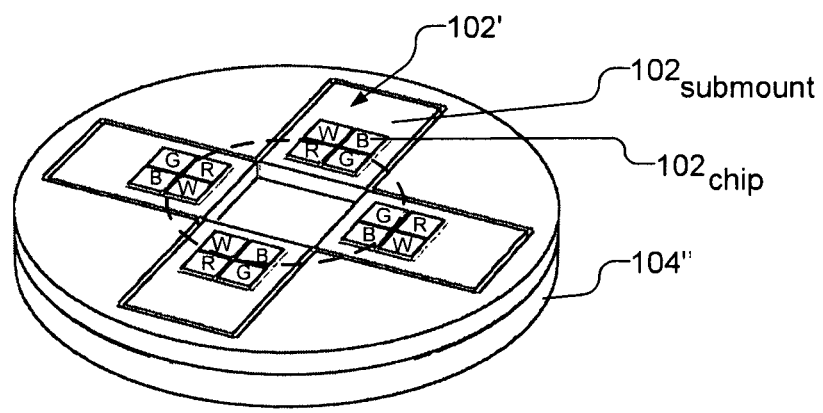
FIG. 7C illustrates another placement pattern of LEDs for the illumination device.

FIG. 7C illustrates another layout of four (4) LEDs 102' on a board 104", where the LEDs 102' do not include a lens. As can be seen, the LEDs 102' may include multiple chips $102_{chip}$ per LED submount $102_{submount}$. The groups of multiple chips have a rotationally symmetry to the center as indicated by the broken lines. In some embodiments, e.g., as illustrated in FIGS. 7A and 7B, a lens may be used, e.g., to protect the chips and to improve light output. The chips $102_{chip}$ may emit different colored light, e.g., red (R), green (G), blue (B) and phosphor converted (W) light as indicated in FIG. 7C. As illustrated, each colored chip $102_{chip}$ may have a different relative position on the submount $102_{submount}$, which may improve color uniformity. Alternatively, chips $102_{chip}$ may be the same color, e.g., blue or UV, to pump a phosphor (red, green, blue, yellow, amber, etc.) directly attached to the chip or located elsewhere in the illumination device. Thus, any desired combination of colored light emitting chips and phosphors may be used.

Figure 8A:
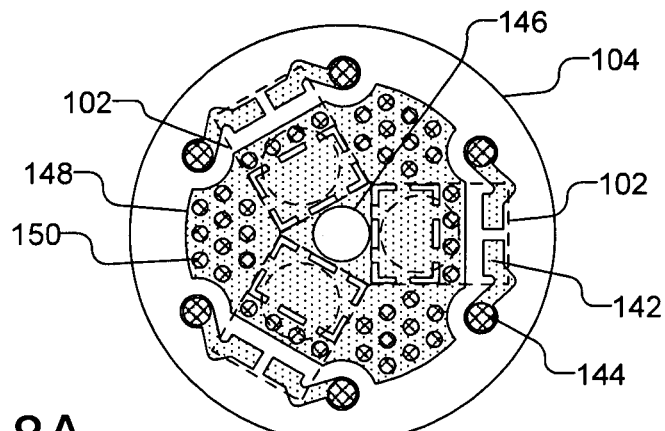
FIGS. 8A, 8B, and 8C illustrate top plan views of LED boards, which may be used with the illumination device.
Figure 8B:
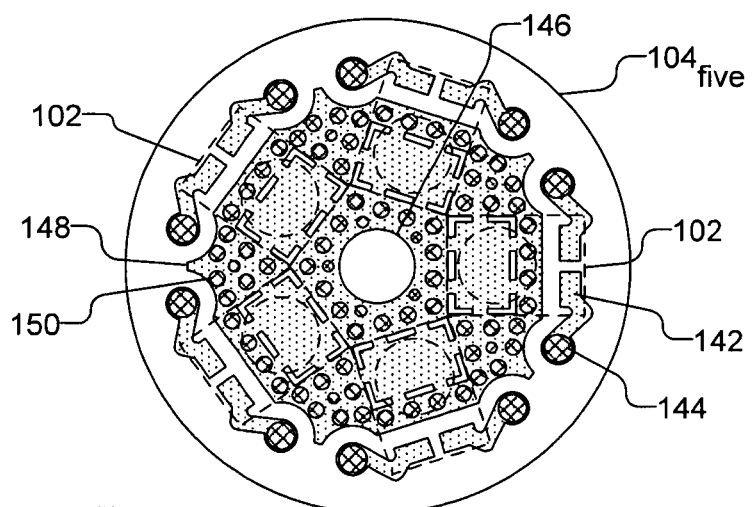
Figure 8C:
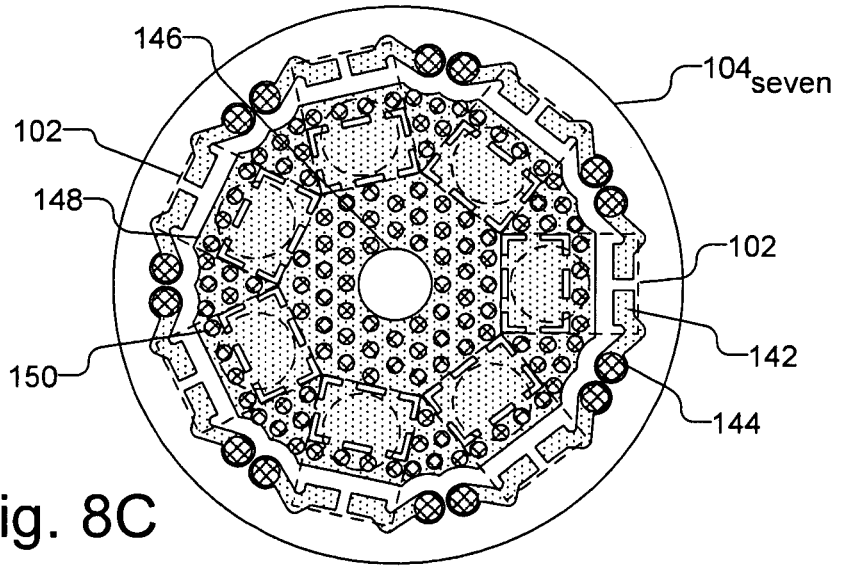

FIGS. 8A, 8B, and 8C, respectively illustrate top plan views of a three LED board 104, five LED board 104$_{five}$, and seven LED board 104$_{seven}$ (sometimes collectively referred to as boards 104), which may be used with the illumination device 100. The outline of the LEDs 102 are shown with broken lines. The boards 104 include electrical pads 142 to which the electrical pads on the LEDs 102 are connected. The electrical pads 142 are electrically connected by a metal, e.g., copper, trace to a contact 144, to which a wire, bridge or other external electrical source is connected. In some embodiments, the electrical pads 142 may be vias through the board 104 and the electrical connection is made on the opposite side, i.e., the bottom, of the board. The boards 104 may include an aperture 146 in the center that may be used allow access from the bottom side of the board. The boards 104 also include heat spreader 148, which may be copper or other appropriate metal. The heat spreader 148 extracts heat from the LEDs 102 and transports heat from the top of the board 104 to the bottom of the board 104 by thermal vias 150. Additionally, the heat spreader 148 may extend around the edge of the aperture 146 to assist in transporting heat to the bottom of the board 104.

Figure 9A:
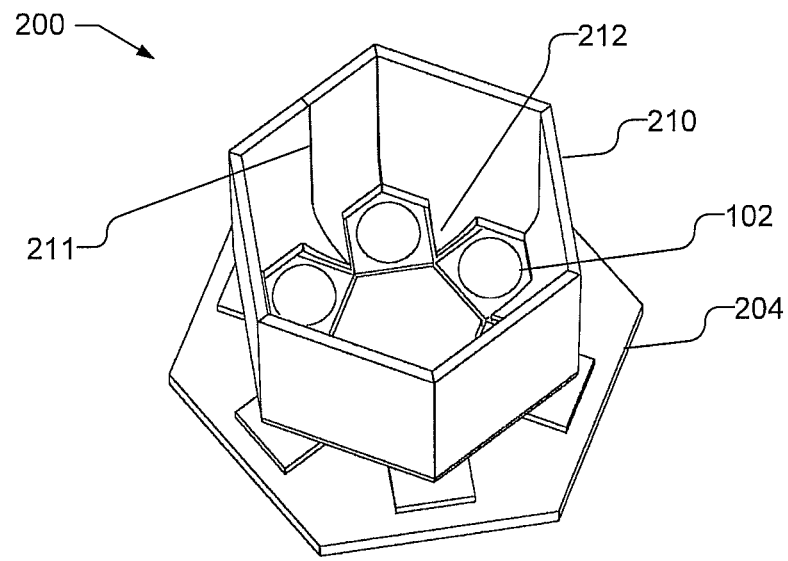
FIGS. 9A and 9B illustrate perspective and top views, respectively, of another embodiment of the illumination device.

FIG. 9A illustrates a perspective view of a illumination device 200, which is similar to illumination device 100, but in which reflective plate 106 is replaced by a portion of the side walls 210. The side walls 210 may be constructed from a single element, such as Miro® material from Alanod, and joined together at joint 211. Bottom portions 212 of the side walls are bent to fit in between the LEDs 102 at the board 204. The use of a single element for the side walls 210 and the bottom reflective surface (in place of the reflective plate 106) advantageously reduces cost.

Figure 9B:
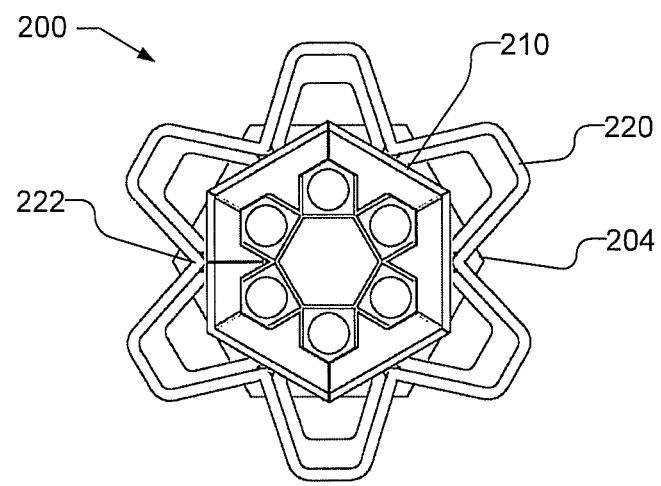

FIG. 9B illustrates a top view of the illumination device 200 along with a heat spreader 220 coupled to the side walls 210. The heat spreader 220 may be formed from, e.g., corrugated sheet metal, and includes ribs 222 that are in thermal contact with the side walls 210. The heat spreader 220 may also be in contact with the board 204. The heat spreader 220 may include perforated holes to enhance heat exchange through convection. In addition, the heat spreader 220 may be made of a black material or painted black to maximize emission by radiation.

FIGS. 10A and 10B illustrate top and bottom perspective views of a illumination device 200' similar to the illumination device 200 shown in FIGS. 9A and 9B. Illumination device 200', however, uses a heat sink 230 having radial fins 232 and an optically reflective hexagonal cavity 234 in the center. The heat sink 230 may be extruded, casted, molded, machined or otherwise manufactured from a thermally conductive material, such as aluminum. In one embodiment, interchangeable side walls 210" may be inserted into the center cavity 234" of the heat sink 230", as illustrated in FIG. 10C, which shows a top perspective view of a illumination device 200" similar to that shown in FIG. 10A. Interchangeable side walls 210" have different configurations for the light mixing cavity 201', i.e., different shapes, but are configured to be inserted into or otherwise mounted to the heat sink 230", thereby obviating the need to redesign the heat sink 230" itself to accommodate different side walls.

Referring back to FIGS. 10A and 10B, the corners of the center cavity 234 may have a bending radius to facilitate the use of a sheet metal insert such as side walls 210. Alternatively, the walls inside the center cavity 234 of the heat sink 230 may be made highly reflective, e.g., by applying a highly reflective coating to the inside of the heat sink 230. In one embodiment, a highly reflective white paint, or (protected and/or enhanced reflectivity) metal or dichroic coatings may be applied to the inside of the heat sink 230. If desired, the inside wall of the heat sink 230 might by partially or completely covered with a phosphor material as well. As illustrated in FIG. 10B, the heat sink 230 may be thermally coupled to the heat spreader on the board 204, e.g., by screwing, or gluing, or by clamping. A thermal paste or thermal tape may be used between the heat sink 230 and the heat spreader on the board 204.

In one embodiment, the height of heat sink 230 may be approximately 12 mm, and the distance between opposite walls of the center (indicated by the letter D) may be approximately the same, i.e., 12 mm. The surface area of the heat sink 230 with these dimensions may be approximately 3500 mm$^2$, i.e., approximately 5.4 square inches, which is one parameter of the cooling capacity of the heat sink 230 and provides a total dissipation of power of approximately 2 Watts. For higher power illumination device, e.g., approximately 10 Watts, the heat sink 230 can be made longer to increase the cooling power. A longer configuration of the heat sink 230 has the benefit that the mixing length of the optical cavity 201 of the illumination device 200' is increased which provides a better uniformity for the light distribution at the output port. With the use of the heat sink 230 coupled to (or forming) the side walls of the illumination device 200', the functions of optical mixing and cooling are combined, resulting in a illumination device with reduced length relative to devices that separate the heat sink from the side walls. If desired, other shapes may be used for the optical cavity 201, such as octagonal, pentagonal or other polygonal shapes. Further, the center cavity 234 may be tapered so that the distance D between opposite walls near the LEDs is different than, e.g., greater or lesser than, the distance between the opposite walls at a location farther from the LEDs.

Figure 11A:
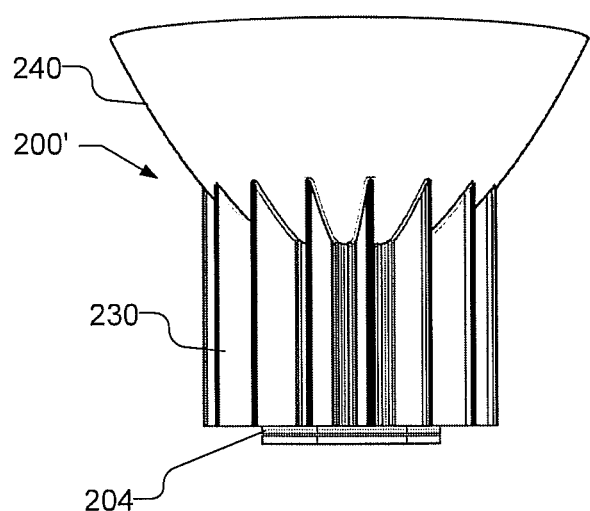
FIGS. 11A and 11B illustrate a side and top views, respectively, of the illumination device shown in FIGS. 10A and 10B.
Figure 11B:
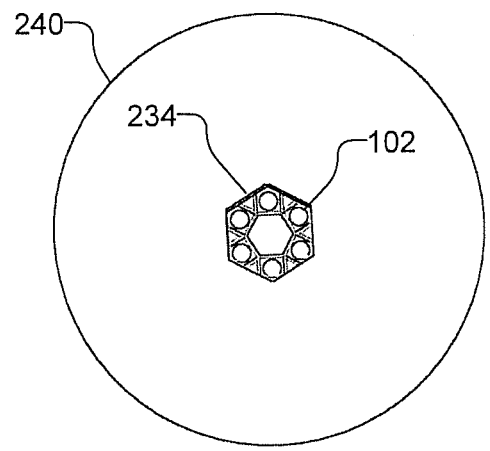

FIGS. 11A and 11B illustrate a side view and a top view of illumination device 200' with heat sink 230 and a reflector 240. The reflector 240 may be made of a metal such as aluminum, copper or alloys thereof, and is thermally coupled to the heat sink 230 to assist in the heat dissipation. An advantage of this configuration is that no additional diffusers are required to homogenize the light, which increases the throughput efficiency.

Figure 12:
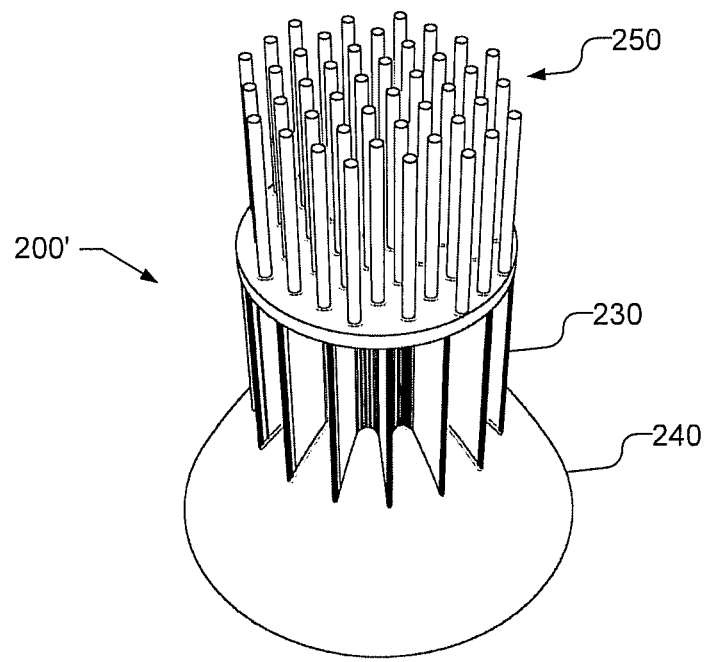
FIG. 12 illustrates a bottom perspective view of an illumination device 200 with a reflector and an additional heat sink thermally coupled to the bottom surface of the board.

FIG. 12 illustrates a bottom perspective view of the illumination device 200' with the reflector 240 and with an additional heat sink 250 thermally coupled to the bottom surface of the board 204. The heat sink 250 may consist of a plurality of pins or other similar configuration. Using a second heat sink 250 permits the LEDs 102 to be driven at higher power, and also allows for different heat sink designs, so that the cooling capacity is less dependent on the orientation of the heat sink. In addition, fans or other solutions for forced cooling may be used to remove the head from the device.

Figure 13:
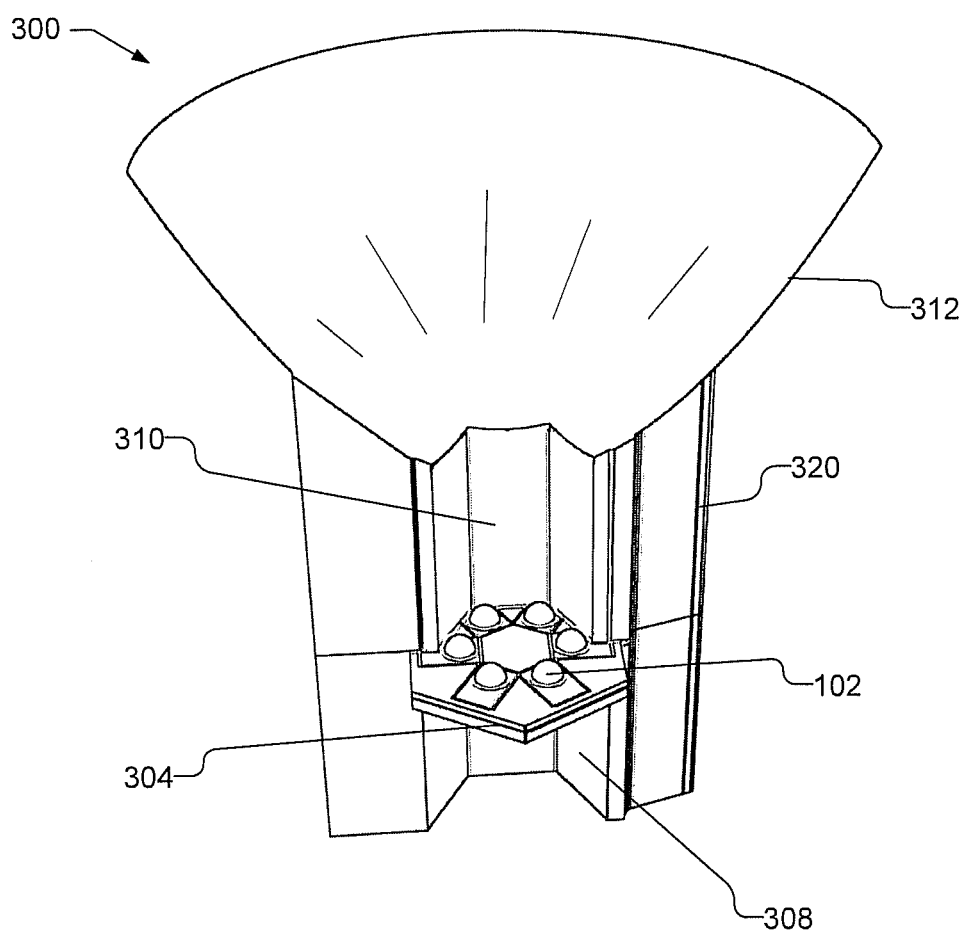
FIG. 13 shows a perspective, partially cut-away view of the illumination device illustrated in FIGS. 11A and 11B.

FIG. 13 illustrates a perspective view of another embodiment of a illumination device 300, similar to illumination device 200 with an integrated color mixing cavity 310, heat sink 320, and reflector 312. A portion of the heat sink 320 is cut away in FIG. 13 to show the board 304 with LEDs 102 and a bottom cavity 308 that is formed by the heat sink 320 extending below the board 304. The bottom cavity 308 may be used for housing electronic or electro-mechanical parts to drive the LEDs 102. Alternatively, the bottom cavity 308 may house a fan. The illumination device 300 also includes a reflector 312 that is coupled to the heat sink 320. The reflector 312 may be removably coupled, e.g., by screw of clamp.

Figure 14A:
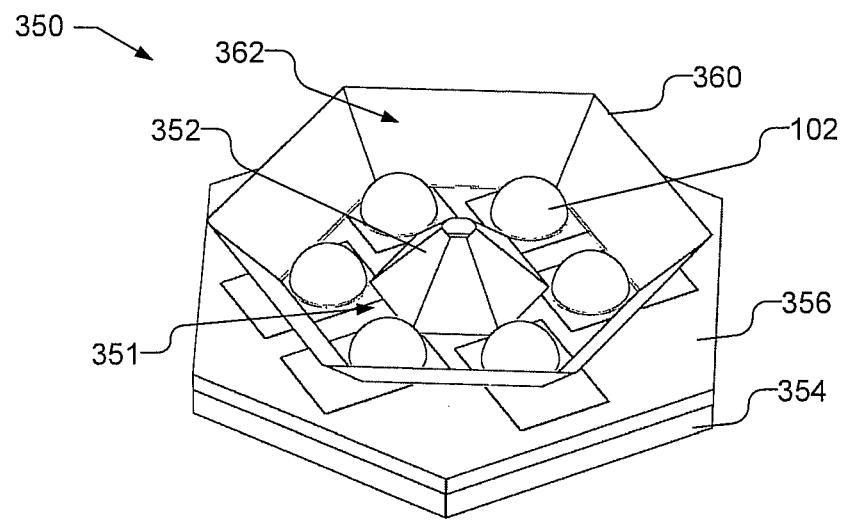
FIGS. 14A, 14B and 14C illustrate perspective views of another embodiment of a illumination device

FIG. 14A illustrates a perspective view of another embodiment of a illumination device 350, with reflective side walls 360 that have a hexagonal configuration that is tapered so that the distance between opposite side walls is less at the bottom of the side walls, i.e., at the reflective plate 356, then at the top of the side walls, i.e., at the output port 362. Illumination device 350 is illustrated in FIG. 14A with a tapered hexagonal center reflector 352, which is configured to redirect light emitted into large angles from the LEDs 102 into narrower angles with respect to normal to the board 354. In other words, light emitted by LEDs 102 that is close to parallel to the board 354 is redirected upwards toward the output port 362 so that the light emitted by the illumination device has a smaller cone angle compared to the cone angle of the light emitted by the LEDs directly. By reflecting the light into narrower angles, the illumination device 350 can be used in applications where light under large angles is to be avoided, for example, due to glare issues (office lighting, general lighting), or due to efficiency reasons where it is desirable to send light only where it is needed and most effective (task lighting, under cabinet lighting.) Moreover, the efficiency of light extraction is improved for the illumination device 350 as light emitted in large angles undergoes less reflections in the light mixing cavity 351 before reaching the output port 362 compared to a device without the center reflector 352. This is particularly advantageous when used in combination with a light tunnel or integrator, as it is beneficial to limit the flux in large angles due to light being bounced around much more often in the mixing cavity, thus reducing efficiency. The reflective plate 356 on the board 354 may be used as an additional heat spreader.

Figure 14B:
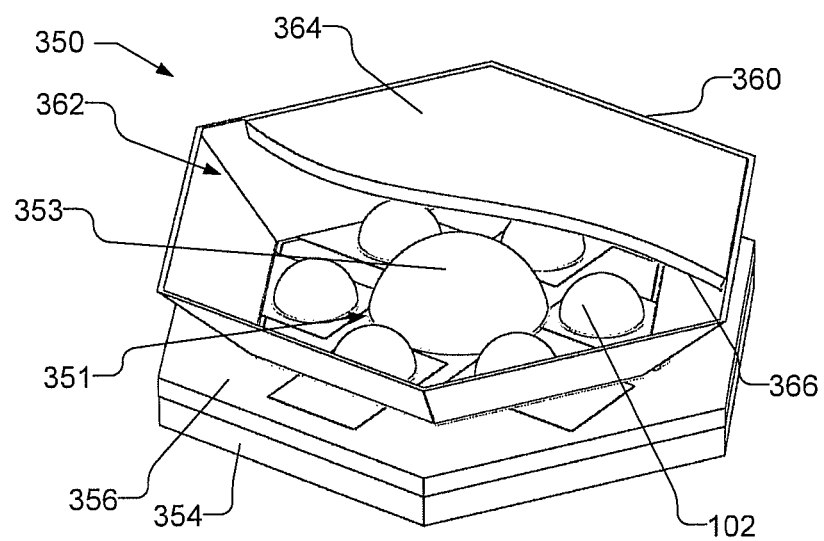

FIG. 14B illustrates another perspective view of illumination device 350, with a window 364 over the output port 362, which may act as a diffuser, and a center dome reflector 353 that is configured to distribute the light from the LEDs 102 over the diffuser window 364. The dome reflector 353 may have either diffuse or mirror like reflective properties. The window 364 may include one or more phosphors. A dichroic mirror 366 layer may be coupled to the window 364 between the LEDs 102 and the phosphor in or on the window 364. The dichroic mirror 366 may be configured to mostly reflect blue light and transmit light with longer wavelengths, which is generated by the phosphor conversion.

Figure 14C:
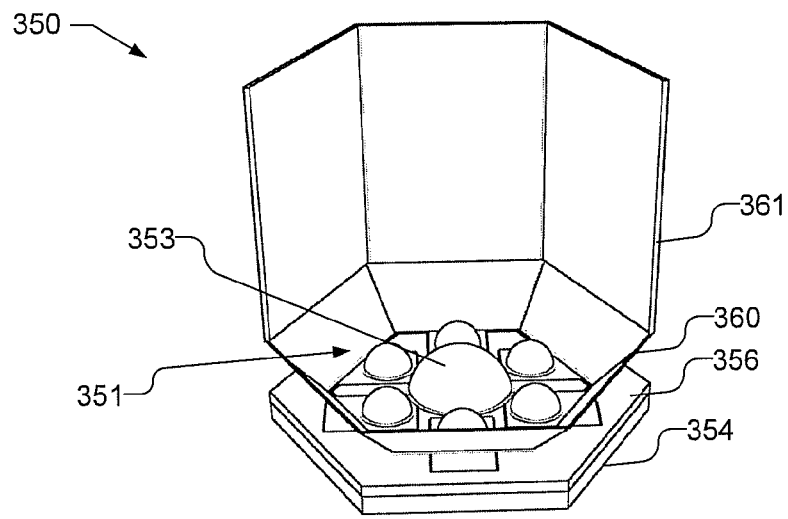

FIG. 14C illustrates another perspective view of illumination device 350 with hexagonal side wall extensions 361 attached to the tapered side walls 360. A portion of the side wall extensions 361 are shown cut away in FIG. 14C. The side wall extensions 361 are less tapered than the tapered side walls 360 and in one embodiment may have no taper. A higher transfer efficiency is achieved through the light mixing cavity 351 by pre-collimation of the light using the tapered side walls 360.

Figures 15A, 15B:
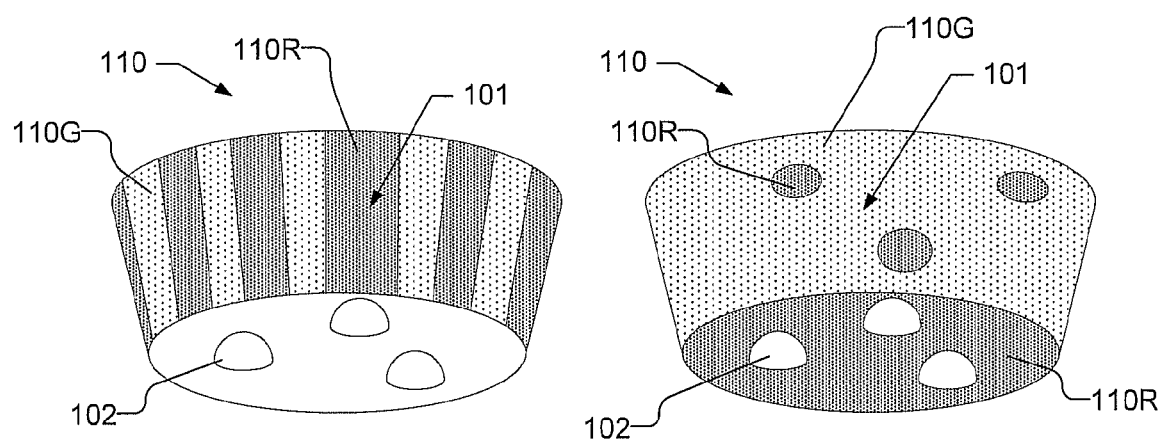
FIGS. 15A and 15B illustrate perspective views of the side walls with patterns of different types of phosphor, e.g., a red phosphor and a green phosphor, inside the cavity.

FIGS. 15A and 15B illustrate perspective views of the side walls 110 with patterns of different types of phosphor, e.g., a red phosphor and a green phosphor, inside the cavity 101. In one embodiment, the illumination device may include different types of phosphors that are located at different areas of the light mixing cavity 101. For example, red and green phosphors may be located on the side walls 110 or the board 104 and a yellow phosphor may be located on the top or bottom surfaces of the window or embedded within the window. In one embodiment, a central reflector such as that shown in FIG. 14C may have patterns of different types of phosphor, e.g., a red phosphor on a first area and a green phosphor on a separate second area. In another embodiment, different types of phosphors, e.g., red and green, may be located on different areas on the sidewalls 110. For example, one type of phosphor 110R may be patterned on the sidewalls 110 at a first area, e.g., in stripes, spots, or other patterns, while another type of phosphor 110G is located on a different second area of the sidewall. If desired, additional phosphors may be used and located in different areas in the cavity 101. Additionally, if desired, only a single type of wavelength converting material may be used and patterned in the cavity 101, e.g., on the sidewalls, where the areas indicated by 110G have no phosphor and are, e.g., reflective or diffusing. An unanticipated result of placing the different phosphors in separate areas is that the light quality and performance results are improved compared to a device in which the phosphors are combined before applying. Table 1 shows the measured difference in performance between separated phosphors and mixed phosphors.

TABLE 1

|  | Cavity coated with spatially separated phosphors | Cavity coated with a mixed phosphors |
| --- | --- | --- |
| Measured optical power | 1.27 W | 1.25 W |
| Measured color rendering index | Ra 82 | Ra 77 |
| Measured color temperature | 2917 K | 2960 K |

Figure 19A:
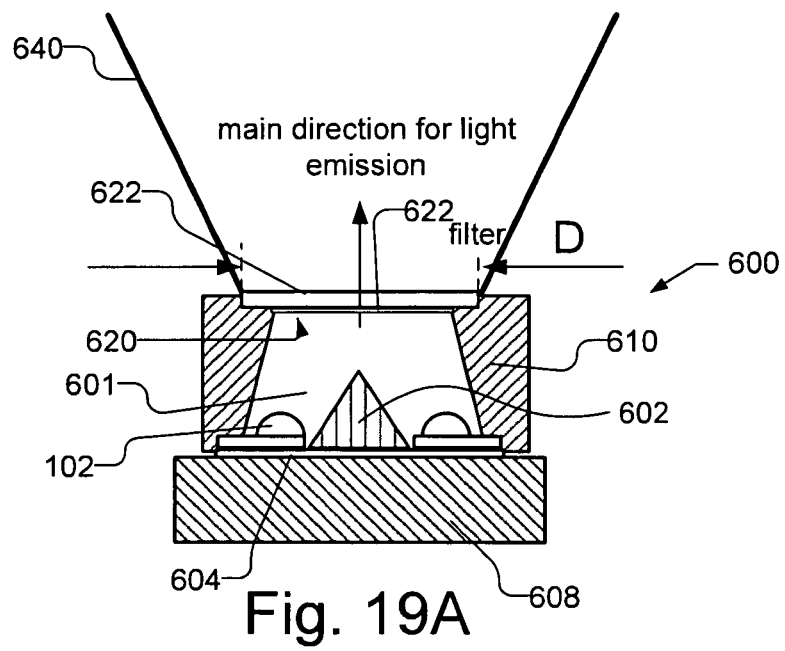
FIG. 19A illustrates a cross sectional view and FIGS. 19B and 19C illustrate top plan views of another illumination device.

The second column in Table 1 shows the results of an experiment where the side walls of a cavity, similar to that shown in FIG. 19A, were coated with alternating stripes of two phosphors. The height of the cavity in this experiment was approximately 6 mm, while the diameter at the bottom was 22 mm, and the diameter at the top 18 mm. In this particular experiment, a flat specular Miro (as produced by Alanod, type Miro 27 Silver) mirror was used at the bottom of the cavity, with a diameter of 13.5 mm. The phosphors used were a YAG:Ce phosphor, and a SrCaAlSiN3:Eu phosphors, which were placed in vertical stripes approximately 2 mm and 3 mm, respectively. At approximately same color points and correlated color temperatures, we achieved a slightly higher output (1.27 W versus 1.25 W), and a large gain in the color rendering index. A color rendering index of Ra 80 is generally accepted is the minimum for many commercial lighting applications. Additionally, applying the phosphors in different areas, simplifies the control of the color balance, e.g., the area of one phosphor can be increased while maintaining the area of the other phosphor the same. Alternatively, a first phosphor can be extended to cover part of the second phosphor.

In an embodiment, a single type of wavelength converting material may be patterned on the sidewall, which may be, e.g., the sidewall insert $110_{sidewall\ insert}$ shown in FIG. 4B. By way of example, a red phosphor may be patterned on different areas of the sidewall insert $110_{sidewall\ insert}$ and a yellow phosphor may cover the window 122, shown in FIG. 4B. The coverage and/or concentrations of the phosphors may be varied to produce different color temperatures. Table 2 shows the percentage of coverage and concentration (by volume) of the red phosphor on a sidewall insert $110_{sidewall\ insert}$ and a yellow phosphor covering 100% of the window 122 to produce the indicated color temperature, with a blue light of 455 nm. It should be understood that the coverage area of the red and/or the concentrations of the red and yellow phosphors will need to vary to produce the desired color temperatures if the blue light produced by the LEDs 102 varies from 455 nm. The color performance of the LEDs 102, red phosphor on the insert sidewall insert $110_{sidewall\ insert}$ and the yellow phosphor on the window 122 may be measured before assembly and selected based on performance so that the assembled pieces produce the desired color temperature. The thickness of the red phosphor may be, e.g., between 40 µm to 80 µm and more specifically between 60 µm to 70 µm, while the thickness of the yellow phosphor may be, e.g., between 50 µm to 100 µm and more specifically between 70 µm to 90 µm.

TABLE 2

| Color Temperature | % of coverage (Red) | Concentration (Red) | Concentration (Yellow) |
|---|---|---|---|
| 4000° K | 40% ± 5% | 13.5% ± 2% | 20% ± 3% |
| 3000° K | 70% ± 5% | 16% ± 2% | 26% ± 3% |
| 2700° K | 100% | 17% ± 2% | 29% ± 3% |

In another embodiment, a single continuous layer of red phosphor may be used on the sidewalls, e.g., on the sidewall insert $110_{sidewall\ inset}$ shown in FIG. 4B. The continuous red phosphor, which covers 100% of the sidewall, and a yellow phosphor covering the window 122 may have different concentrations to produce different color temperatures. Table 3 shows the concentrations (by volume) of a red phosphor on a sidewall insert $110_{sidewall\ insert}$ and a yellow phosphor covering 100% of the window 122 to produce the indicated color temperature, with a blue light of 455 nm. It should be understood that the concentrations of the red and yellow phosphors will need to vary to produce the desired color temperatures if the blue light produced by the LEDs 102 varies from 455 nm. The color performance of the LEDs 102, red phosphor on the insert sidewall insert $110_{sidewall\ insert}$ and the yellow phosphor on the window 122 may be measured before assembly and selected based on performance so that the assembled pieces produce the desired color temperature. The thickness of the red phosphor may be, e.g., between 70 µm to 110 µm and more specifically between 85 µm to 95 µm, while the thickness of the yellow phosphor may be, e.g., between 50 µm to 100 µm and more specifically between 70 µm to 90 µm.

TABLE 3

| Color Temperature | Concentration (Red) | Concentration (Yellow) |
|---|---|---|
| 4000° K | 2.5% ± 2% | 20% ± 3% |
| 3000° K | 8% ± 2% | 26% ± 3% |
| 2700° K | 16% ± 2% | 29% ± 3% |

Figure 16:
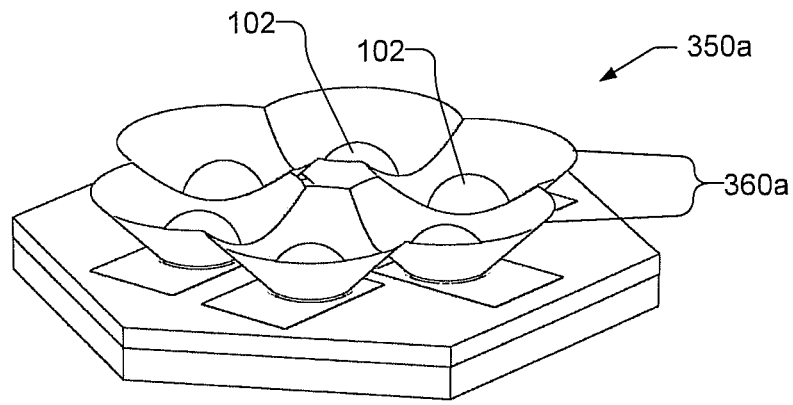
FIG. 16 illustrates another embodiment of an illumination device having a reflector array.

FIG. 16 illustrates another embodiment of a illumination device 350a, which is similar to illumination device 350 shown in FIG. 14A, except each LED 102 in illumination device 350a is surrounded by a separate individual side wall reflector 360a, which may have a parabolic, compound parabolic, elliptical shape, or other appropriate shape. The light from illumination device 350a is collimated from large angles into smaller angles, e.g., from a 2×90 degree angle to a 2×60 degree angle, or a 2×45 degree beam. The illumination device 350a can be used as a direct light source, for example, as a down light or an under the cabinet light, or it can be used to inject the light into a light mixing cavity, e.g., such as that defined by side walls 210 as shown in FIGS. 9A and 9B. The illumination device 350a may be thermally coupled between a top and bottom heat sinks, such as that illustrated in FIG. 4A.

Figure 17:
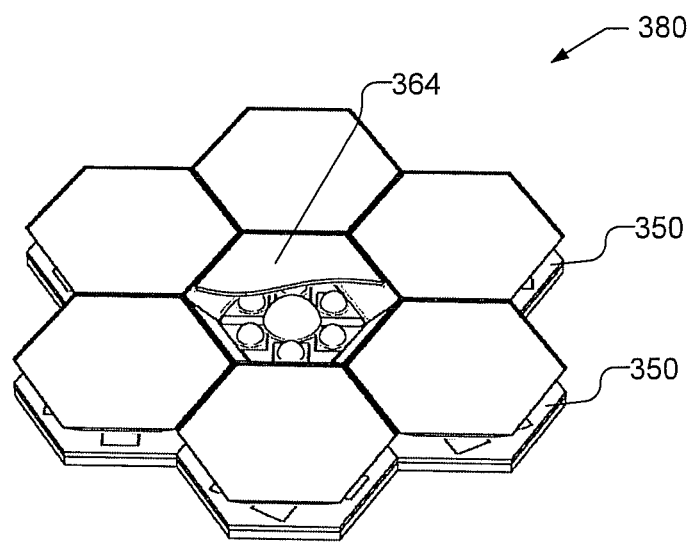
FIG. 17 illustrates a plurality of illumination devices arranged together to form a larger lighting module.

FIG. 17 illustrates a plurality of illumination devices 350 that are arranged together to form a large lighting module 380. The center illumination device 350 illustrated in FIG. 17 is shown with the window 364 partly cut away to illustrated the underlying LEDs 102. If desired, the illumination devices 350 may be arranged in different configurations to form, e.g., a linear structure, a semi-circular or circular structure, a hexagonally closely packed structure, or other desired configurations.

Figure 18:
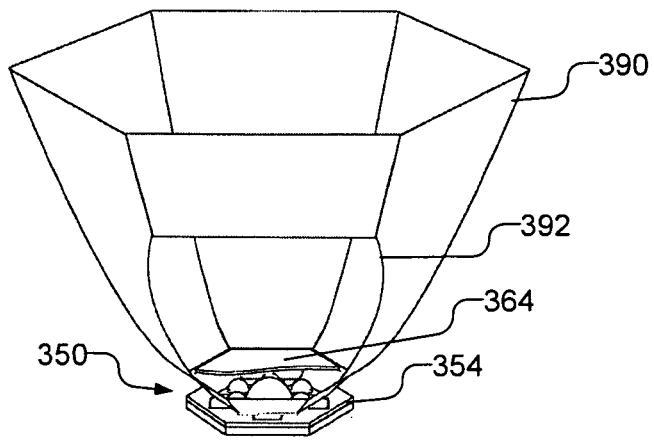
FIG. 18 illustrates an illumination device with a hexagonal reflector.

FIG. 18 illustrates a illumination device 350 with a hexagonal reflector 390. The hexagonal reflector 390 is illustrated with a cut-away portion 392 to provide a view of the illumination device 350, which is illustrated with a partially cut-away window 364. The hexagonal reflector 390 may be made from a highly thermally conductive material, e.g., sheet metal, and may be thermally coupled to the LED board 354 or a heat sink 610, as for example, illustrated in FIG. 19A. The use of a hexagonal reflector 390 is advantageous as it permits multiple reflectors to be stacked together to form a compact array of collimators. Additionally, a reflector with a hexagonal configuration (as opposed to a circular configuration) better facilitates uniformity (color and brightness) coming out of the reflector.

Figure 19B:
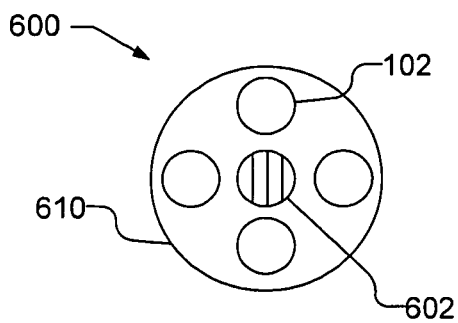
Figure 19C:
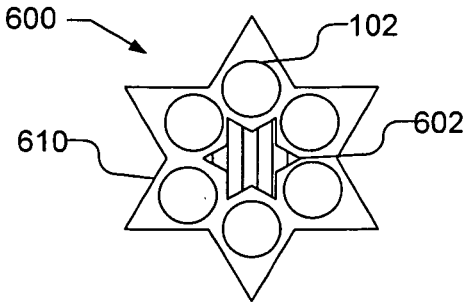

FIG. 19A illustrates a cross sectional view of another embodiment of a illumination device 600, similar to illumination device 100, shown in FIGS. 1 and 2. Illumination device 600 is illustrated with LEDs 102 mounted on a board 604 that is mounted on a heat sink 608. Additionally, side walls 610 are shown as tapered so that the cross-sectional area of the cavity 601 at the bottom, e.g., proximate to the LEDs 102, is greater than the cross-sectional area of the cavity 601 at the top, e.g., distal to the LEDs 102. As with illumination device 100, the side walls 610 of illumination device 600 may define a cavity 601 with a continuous shape, e.g., circular (elliptical) as illustrated in FIG. 19B or a non-continuous polygonal shape, as illustrated in FIG. 19C, or a combination thereof.

Illumination device 600 may further include a diverter 602, which may be placed centrally in the cavity 601. The use of this diverter 602 helps to improve the efficiency of the illumination device 600 by redirecting light from the LEDs 102 towards the window 622. In FIG. 19A the diverter 602 is illustrated as having a cone shape, but alternative shapes may be used if desired, for example, a half dome shape, or a spherical cap, or aspherical reflector shapes. Moreover as illustrated in FIGS. 19B and 19C, the diverter 602 may have various shapes in plan view. The diverter 602 can have a specular reflective coating, a diffuse coating, or can be coated with one or more phosphors. The height of the diverter 602 may be smaller than the height of the cavity 601 (e.g., approximately half the height of the cavity 601) so that there is a small space between the top of the diverter 602, and the window 622.

In one embodiment a YAG phosphor is used on the side walls 610 and the board 604 at the bottom of the cavity 601, and a red emitting phosphor such as $CaAlSiN_3$:Eu, or (Sr,Ca)$AlSiN_3$:Eu is used on the window 622. By choosing the shape of the side of the cavity, and selecting which of the parts in the cavity will be covered with phosphor or not, and by optimization of the layer thickness of the phosphor layer on the window, the color point of the light emitted from the module can be tuned to the color as desired by the customers.

In one embodiment, a blue filter $622_{filter}$ may be coupled to the window 622 to prevent too much blue light from being emitted from the illumination device 600. The blue filter $622_{filter}$ may be an absorbing type or a dichroic type, with no or very little absorption. In one embodiment, the filter $622_{filter}$ has a transmission of 5% to 30% for blue, while a very high transmission (greater than 80%, and more particularly 90% or more) for light with longer wavelengths.

FIGS. 20A, 20B, 20C, and 20D illustrate various configurations of the window 622 shown in cross sectional views.

The window 622 is placed into or on top of the side wall 610. In these cross sectional views only part of the side wall 610 is shown.

Figure 20A:
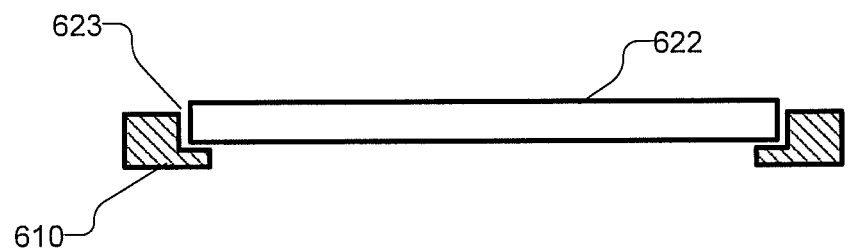
FIGS. 20A, 20B, 20C, and 20D illustrate cross sectional views of various configurations of the window used with an illumination device.

In FIG. 20A, the window 622 is shown mounted on top of the side wall 610. It can be beneficial to seal the gap 623 between the window 622 and the side wall 610 to form a hermetically sealed cavity 601 (FIG. 19A), such that no dust or humidity can enter the cavity 601. A sealing material may be used to fill the gap 623 between the window 622 and the side wall 610, as for example an epoxy or a Silicone material. It may be beneficial to use a material that remains flexible over time due to the differences in thermal expansion coefficients of the materials of the window 622 and side wall 610. As an alternative, the window 622 might be made of glass or a transparent ceramic material, and soldered onto the side walls 610. In that case, the window 622 may be plated at the edges with a metallic material, such as aluminum, or silver, or copper, or gold, and solder paste is applied in between the side wall 610 and window 622. By heating the window 622 and the side wall 610, the solder will melt and provide a good connection between the side wall 610 and window 622.

Figure 20B:
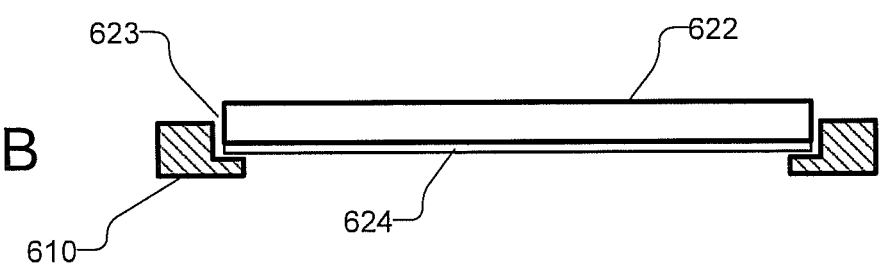

In FIG. 20B, the window 622 has an additional layer 624 on the inside surface of the window, i.e., the surface facing the cavity 601. The additional layer 624 may contain either white diffusing particles, or particles with wavelength converting properties such as phosphors. The layer 624 can be applied to the window 622 by screen printing, spray painting, or powder coating. For screen printing and spray painting, typically the particles are immersed in a binder, which can by a polyurethane based lacquer, or a Silicone material. For powder coating a binding material is mixed into the powder mix in the form of small pellets which have a low melting point, and which make a uniform layer when the window 622 is heated, or a base coat is applied to the window 622 to which the particles stick during the coating process. Alternatively, the powder coating may be applied using an electric field, and the window and phosphor particles baked in an oven so that the phosphor permanently adheres to the window. The thickness and optical properties of the layer 624 applied to the window 622 may be monitored during the powder coat process for example by using a laser and a spectrometer, and/or detector, or and/or camera, both in forward scatter and back scattered modes, to obtain the right color and/or optical properties.

Figure 20C:
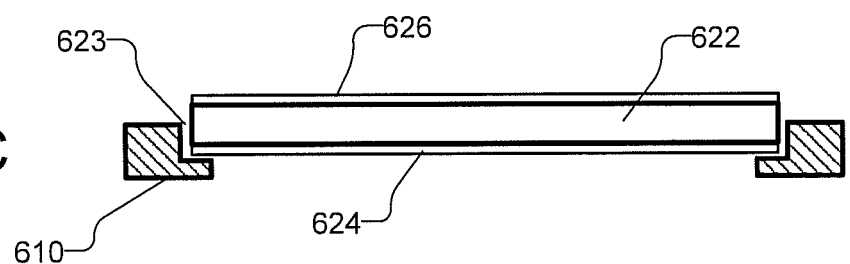

In FIG. 20C the window 622 has two additional layers 624 and 626; one on the inside of the window and one on the outside of the window 622, respectively. The outside layer 626 may be white scattering particles, such as TiO2, ZnO, and/or BaSO4 particles. Phosphor particles may be added to the layer 626 to do a final adjustment of the color of the light coming out of the illumination device 600. The inside layer 624 may contain wavelength converting particles, such as a phosphor.

Figure 20D:
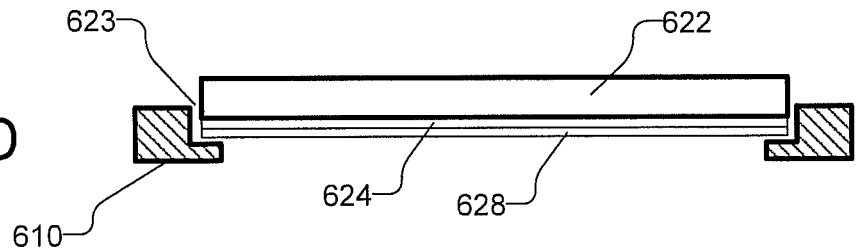

In FIG. 20D the window 622 also has two additional layers 624 and 628, but both are on the same inside surface of the window 622. While two layers are shown, it should be understood that additional layers may be used. In one configuration, layer 624, which is closest to the window 622, includes white scattering particles, such that the window appears white if viewed from the outside, and has a uniform light output over angle, and layer 628 includes a red emitting phosphor. The surfaces of the side walls 610 and/or the board 604 may be coated with a yellow or green emitting phosphor.

The phosphor conversion process generates heat and thus the window 622 and the phosphor, e.g., in layer 624, on the window 622 should be configured so that they do not get too hot. For this purpose, the window 622 may have a high thermal conductivity, e.g., not less than 1 W/(m K), and the window 622 may be thermally coupled to the side wall 610, which serves as a heat-sink, using a material with low thermal resistance, such as solder, thermal paste or thermal tape. A good material for the window is aluminum oxide, which can be used in its crystalline form, called Sapphire, as well in its poly-crystalline or ceramic form, called Alumina.

Figure 21:
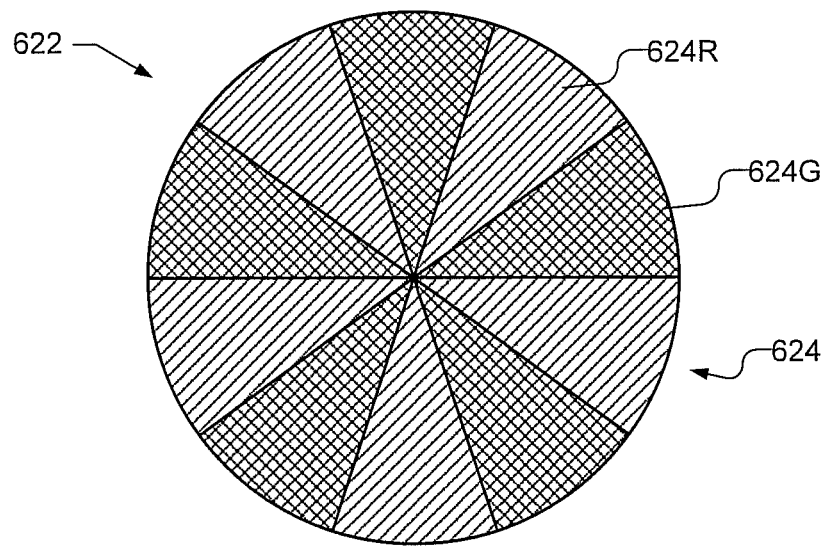
FIG. 21 is a bottom view of the window covered with a patterned layer of phosphors.

FIG. 21 is a bottom view of the window 622 covered with a patterned layer 624 of phosphors. A wedge or pie-shaped pattern may be used to form the layer 624, if desired, using two types of wavelength converting materials, where the wedges for example have alternating red emitting phosphor 624R and green emitting phosphor 624G. Using a radial pattern as illustrated in FIG. 21 may provide good color mixing when used in combination with a reflective collimator. Other patterns may be used if desired as for example small dots with varying size, thickness and density.

Figure 22A:
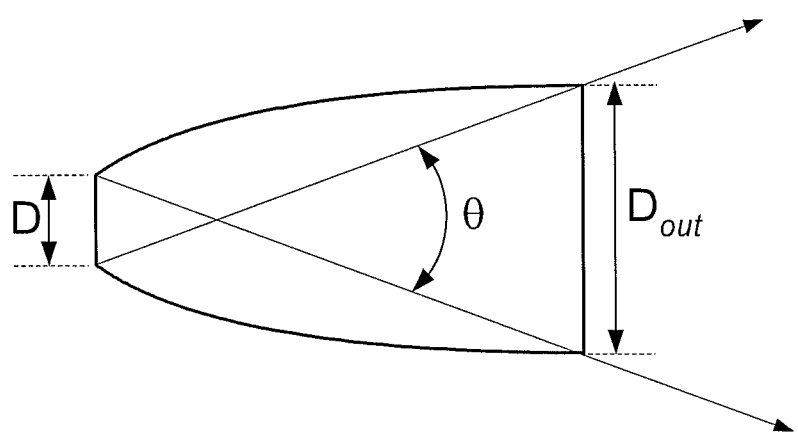
FIGS. 22A and 22B illustrate the effect of the aperture size of the window on the beam angle produced by a reflector placed on top of the illumination device.
Figure 22B:
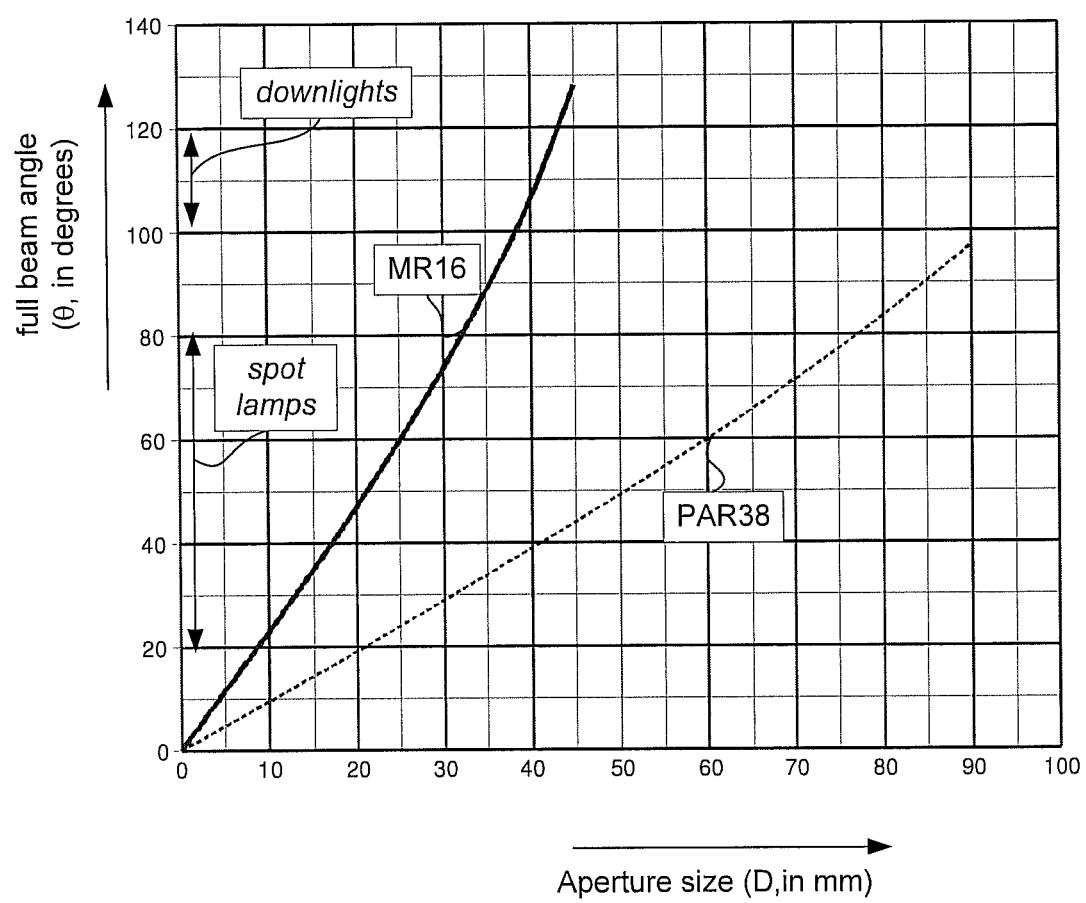

FIGS. 22A and 22B illustrate the effect of the aperture size of the window 622 on the beam angle produced by a reflector 640 placed on top of the illumination device 600 (as illustrated in FIG. 19A). The model used for the results of FIGS. 22A and 22B is based on a compound parabolic concentrator design, which gives the smallest total angle for the beam coming out of the reflector. The total angle is the angle that light will be emitted from the reflector 640, such that is there will be no or very little light beyond this angle. For down lights for example, this total angle is typically in the range of 100 to 120 degrees (60 degree cut-off with the normal to the reflector opening), while for spot lamps this total angle is more in the range of 20 to 80 degrees.

FIG. 22A shows a cross sectional view of a reflector 640 that is a compound parabolic concentrator, where the concentrator is made out of a highly reflecting material. Indicated is a measure for the input diameter for the concentrator D, and the full beam angle measurement θ, and the output diameter $D_{out}$. Compound parabolic concentrators tend to be tall, but they often are used in a reduced length form, which increases the beam angle. The beam angle as a function of aperture size D is shown in FIG. 22B for two sizes of the output diameter $D_{out}$ of the reflector 640, specifically an MR16 reflector lamp size, which has an output diameter $D_{out}$ of about 50 mm, and a PAR38 size, which has an output diameter $D_{out}$ of about 120 mm.

For the size of an MR16 lamp equivalent diameter reflector, typical aperture size may be in the range of 10 to 30 mm for spot lamps, while for an MR16 down-light the aperture size may be about 40 mm. For a PAR 38 equivalent diameter reflector, typical aperture size is in the range of 20 mm to 75 mm, e.g., 50 mm, for spot lamps, while for the down-light function for the PAR38 the aperture size should be less than 100 mm.

The sizes for the apertures given here should be considered as maximum sizes, as cut-off angles tend to become wider. In addition, center beam intensity increases proportional to the area of the output of the reflector compared to the input area of the reflector.

Figure 23:
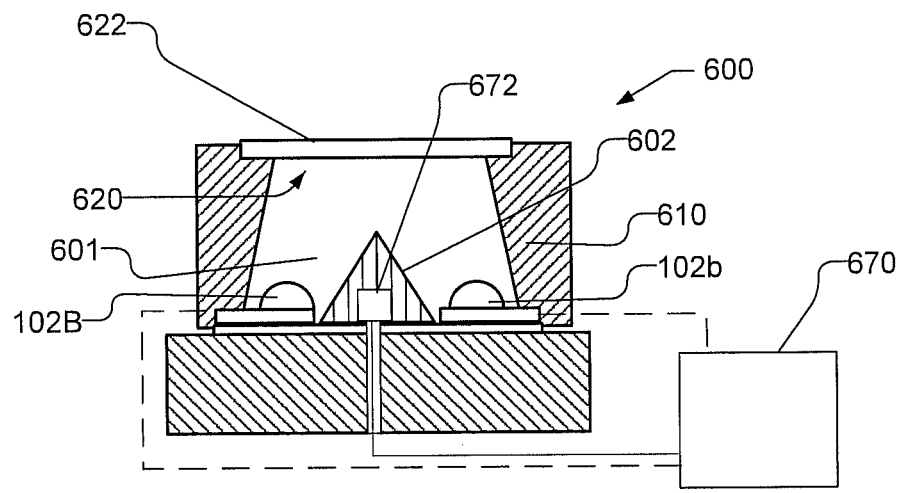
FIG. 23 illustrates a cross-sectional view of illumination device that is electronically controllable to produce a desired color point.

FIG. 23 illustrates a cross-sectional view of illumination device 600 that is electronically controllable to produce a desired color point. The color of the light output of the illumination device 600 (shown in FIG. 23) is changed by using at least two blue LEDs 102B and 102b, where one has a lower peak wavelength than the other LED. One blue LED 102b may have a peak wavelength in the range of 430 to 450 nm, while the other LED 102B may have a peak wavelength in the range of 450 nm to 470 nm. If more than two LEDs are used, the LEDs with the lower wavelength may be all electrically connected, and the LEDs with a longer wavelength may be electrically connected, but electrically separate from the lower LEDs with the lower wavelengths. A driver 670 is supplied, which can drive a different current through the group with lower wavelength LEDs 102*b* than the group with longer wavelength LEDs 102B. It should be understood that the driver 670 is coupled to the LEDs 102B and 102*b* through the board 604, but that for illustrative purposes the connections are shown with a broken lines in FIG. 23. As the at least one phosphor in the illumination device 600 responds differently to lower wavelength light than higher wavelength light, a different color light output is achieved, which can be controlled by changing the current through the two different strings of LEDs 102B and 102*b*. Optionally, a sensor 672 is used inside the cavity to measure the light output or color of the illumination device 600 and to provide that measurement in a feed back loop to control the driver 670. The sensor 672 may be mounted at the output window of illumination device 600, or on the bottom, top, or side of the cavity or inside a partially transparent diverter 602, as illustrated in FIG. 23.

Although the present invention is illustrated in connection with specific embodiments for instructional purposes, the present invention is not limited thereto. It should be understood that the embodiments described herein may use any desired wavelength converting materials, including dyes, and are not limited to the use of phosphors. Various adaptations and modifications may be made without departing from the scope of the invention. Therefore, the spirit and scope of the appended claims should not be limited to the foregoing description.

What is claimed is:

1. A light emitting diode illumination device comprising:
   a mounting board having electrical connections;
   a reflective material disposed on a top surface of the mounting board;
   a heat sink thermally coupled to the mounting board;
   a plurality of light emitting diodes mounted on the top surface of the mounting board and coupled to the electrical connections, wherein the light emitted by the plurality of light emitting diodes is emitted into a non-solid material, the plurality of light emitting diodes producing light having a color point;
   a light mixing cavity having a circular configuration defined by a reflective sidewall insert element that is fixedly positioned within a cavity formed by at least one sidewall coupled to the mounting board, the reflective sidewall insert element having at least one type of wavelength converting material on sidewalls, and wherein the light from the plurality of light emitting diodes is received and combined by the light mixing cavity;
   a window covering an output port through which light from the light mixing cavity is transmitted, the window including a layer of wavelength converting material, wherein the at least one type of wavelength converting material on the reflective sidewall insert element is configured to alter the color point of the light produced by the plurality of light emitting diodes to produce a desired color point for the light transmitted through the output port, wherein the reflective sidewall insert element extends from the reflective material disposed on the top surface of the mounting board to the window; and
   a central reflective element coupled to the mounting board at a center position of the mounting board, the central reflective element extending from the mounting board towards the window wherein the central reflector is wider near the mounting board than near the window.

2. The light emitting diode illumination device of claim 1, further comprising a first type of wavelength converting material covering a first area of the cavity and a second type of wavelength converting material covering a second area of the cavity, the second area being a different than the first area.

3. The light emitting diode illumination device of claim 1, wherein the output port has at least one of an elliptical and polygonal configuration.

4. The light emitting diode illumination device of claim 1, wherein the layer of wavelength converting material partially covers the window.

5. The light emitting diode illumination device of claim 1, wherein the central reflective element has a tapered configuration or a dome configuration.

6. The light emitting diode illumination device of claim 5, wherein a first area of the central reflective element is covered with a first type of wavelength converting material and a second area of the central reflective element is covered with a second type of wavelength converting material, the second area being a different than the first area.

7. The light emitting diode illumination device of claim 1, wherein the light mixing cavity has a first cross-sectional area proximate to the plurality of light emitting diodes and a second cross sectional area distal to the plurality of light emitting diodes, wherein the first cross-sectional area is different than the second cross-sectional area.

8. A light emitting diode illumination device comprising:
   a mounting board having electrical connections, wherein the mounting board has a top surface and a bottom surface opposite the top surface, the mounting board having a first thermal contact area on the bottom surface and a second thermal contact area on the top surface;
   at least one light emitting diode mounted on the top surface of the mounting board and coupled to the electrical connections, the at least one light emitting diode producing light having a color point;
   a reflective material disposed on the top surface of the mounting board;
   at least one sidewall coupled to the mounting board and configured to define a cavity into which light from the at least one light emitting diode is emitted;
   a reflective insert element that is fixedly positioned within the cavity to form reflective sidewalls within the cavity;
   at least one type of wavelength converting material on the reflective sidewalls of the reflective insert element;
   an output port through which light inside the cavity is transmitted, wherein the at least one type of wavelength converting material on the reflective sidewalls of the reflective insert element is configured to alter the color point of the light produced by the at least one light emitting diode to produce a desired color point for the light transmitted through the output port;
   a window having a wavelength converting material over the output port, wherein the reflective insert element extends from the reflective material on the top surface of the mounting board to the window;
   a first heat sink thermally coupled to the first thermal contact area on the bottom surface of the mounting board; and
   a second heat sink thermally coupled to the second thermal contact area on the top surface of the mounting board.

9. The light emitting diode illumination device of claim 8, wherein the at least one type of wavelength converting material comprises a first type of wavelength converting material covering a first area of the reflective sidewalls of the reflective insert element, the first area being less than the total area of the reflective insert element.

10. The light emitting diode illumination device of claim 9, further comprising a second type of wavelength converting material covering a second area of the reflective sidewalls of the reflective insert element, the second area being different than the first area.

11. The light emitting diode illumination device of claim 8, wherein the window includes a layer of a dichroic coating.

12. The light emitting diode illumination device of claim 8, wherein the second heat sink comprises a top surface and a bottom surface and an aperture from the top surface to the bottom surface that defines the at least one sidewall.

13. A light emitting diode illumination device comprising:
a mounting board having electrical connections;
a reflective material disposed on a top surface of the mounting board;
at least one light emitting diode mounted on the top surface of the mounting board and coupled to the electrical connections, the at least one light emitting diode producing light having a color point;
at least one sidewall coupled to the mounting board and configured to define a cavity into which light from the at least one light emitting diode is emitted;
a reflective insert element that is fixedly positioned within the cavity to form a continuous reflective sidewall within the cavity, the reflective insert element formed from a sheet element with at least one type of wavelength converting material applied to the sheet element, wherein the reflective insert element is selected from a plurality of reflective insert elements based on measured color performance of the selected reflective insert element and the color point of the at least one light emitting diode;
an output port through which light inside the cavity is transmitted, wherein the at least one type of wavelength converting material on the sheet element of the reflective insert element is configured to alter the color point of the light produced by the at least one light emitting diode to produce a desired color point for the light transmitted through the output port, wherein the reflective sidewall insert element extends from the reflective material disposed on the top surface of the mounting board to the output port.

14. The light emitting diode illumination device of claim 13, wherein the sheet element is a reflective sheet metal element and the wavelength converting material is coated on the reflective sheet metal element.

15. The light emitting diode illumination device of claim 13, wherein the wavelength converting material is impregnated into the sheet element.

16. The light emitting diode illumination device of claim 13, further comprising applying a reflective coating to the sheet element.

* * * * *